(12) United States Patent
Hwang et al.

(10) Patent No.: US 12,538,484 B2
(45) Date of Patent: Jan. 27, 2026

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Sung-Min Hwang, Suwon-si (KR); Jaehoon Lee, Suwon-si (KR); Seunghyun Cho, Suwon-si (KR); Jae-Joo Shim, Suwon-si (KR); Dong-Sik Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 486 days.

(21) Appl. No.: 18/127,404

(22) Filed: Mar. 28, 2023

(65) Prior Publication Data

US 2024/0098990 A1    Mar. 21, 2024

(30) Foreign Application Priority Data

Sep. 21, 2022   (KR) .................. 10-2022-0119627

(51) Int. Cl.
*H10B 43/27*    (2023.01)
*H01L 23/528*   (2006.01)
*H10B 41/10*    (2023.01)
*H10B 41/27*    (2023.01)
*H10B 41/35*    (2023.01)

(52) U.S. Cl.
CPC ......... *H10B 41/27* (2023.02); *H01L 23/5283* (2013.01); *H10B 41/10* (2023.02); *H10B 41/35* (2023.02)

(58) Field of Classification Search
CPC ........ H10B 43/27; H10B 41/27; H10B 43/10; H10B 41/10
See application file for complete search history.

(56) References Cited

U.S. PATENT DOCUMENTS

| | | |
|---|---|---|
| 9,236,340 B2 | 1/2016 | Lee et al. |
| 9,947,683 B2 | 4/2018 | Shimojo |
| 10,242,997 B2 | 3/2019 | Choi et al. |
| 10,403,719 B2 | 9/2019 | Choi et al. |
| 10,707,229 B2 | 7/2020 | Cho et al. |
| 10,930,739 B2 | 2/2021 | Choi et al. |
| 2017/0077124 A1* | 3/2017 | Shimojo ........... H01L 21/76877 |
| 2017/0125439 A1* | 5/2017 | Choi ..................... H10B 43/40 |
| 2021/0035910 A1 | 2/2021 | Kim et al. |
| 2021/0104538 A1 | 4/2021 | Lee et al. |

* cited by examiner

*Primary Examiner* — Christopher A Johnson
(74) *Attorney, Agent, or Firm* — Sughrue Mion, PLLC

(57) ABSTRACT

A semiconductor device includes a gate stack structure including insulating patterns and conductive patterns which are alternately stacked, a first separation structure penetrating the gate stack structure, a second separation structure penetrating the gate stack structure and being adjacent to the first separation structure, first and second memory channel structures penetrating the gate stack structure and disposed between the first separation structure and the second separation structure, a first bit line overlapping with the first and second memory channel structures and electrically connected to the first memory channel structure, and a second bit line overlapping with the first and second memory channel structures and the first bit line and electrically connected to the second memory channel structure.

20 Claims, 17 Drawing Sheets

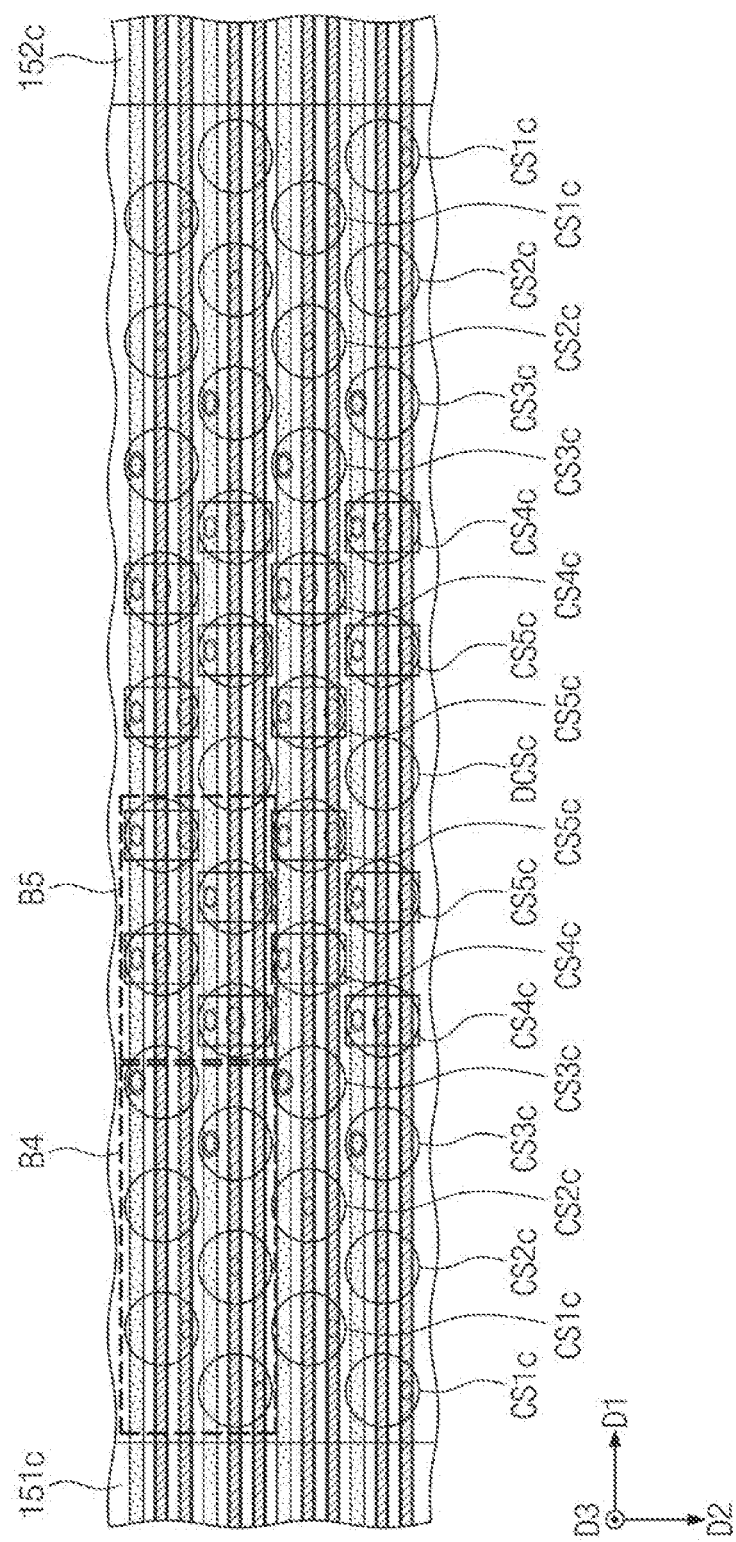

SEMICONDUCTOR DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2022-0119627, filed on Sep. 21, 2022, in the Korean Intellectual Property Office, the entire contents of which being hereby incorporated by reference.

BACKGROUND

The present disclosure relates to a semiconductor device and an electronic system including the same and, more particularly, to a semiconductor device including bit lines overlapping with each other and an electronic system including the same.

Semiconductor devices are widely used in an electronic industry because of their small sizes, multi-functional characteristics, and/or low manufacturing costs. Semiconductor devices may be categorized as any one of semiconductor memory devices for storing logical data, semiconductor logic devices for processing logical data, and hybrid semiconductor devices having both the function of the semiconductor memory devices and the function of the semiconductor logic devices.

As high-speed and/or low-power electronic devices have been demanded, high-speed and/or low-voltage semiconductor devices used therein have also been demanded, and highly integrated semiconductor devices have been required to satisfy these demands. However, as the integration densities of semiconductor devices increase, electrical characteristics and production yields of the semiconductor devices may be deteriorated or reduced. Thus, techniques for improving electrical characteristics and production yields of semiconductor devices have been variously studied.

SUMMARY

It is an aspect to provide a semiconductor device with improved electrical characteristics and reliability and an electronic system including the same.

According to an aspect of one or more embodiments, a semiconductor device may include a gate stack structure comprising insulating patterns and conductive patterns which are alternately stacked; a first separation structure penetrating the gate stack structure; a second separation structure penetrating the gate stack structure and being adjacent to the first separation structure; a first memory channel structure and a second memory channel structure which penetrate the gate stack structure and are disposed between the first separation structure and the second separation structure a first bit line overlapping with the first memory channel structure and the second memory channel structure in a vertical direction and electrically connected to the first memory channel structure; and a second bit line overlapping with the first memory channel structure in the vertical direction, the second memory channel structure and the first bit line and electrically connected to the second memory channel structure.

According to another aspect of one or more embodiments, a semiconductor device may include a gate stack structure comprising insulating patterns and conductive patterns which are alternately stacked; a first memory channel structure and a second memory channel structure which penetrate the gate stack structure: a first bit line overlapping with the first memory channel structure and the second memory channel structure in a vertical direction and electrically connected to the first memory channel structure; a second bit line overlapping with the first memory channel structure and the second memory channel structure in the vertical direction and electrically connected to the second memory channel structure; and a first bypass structure electrically connecting the second bit line to the second memory channel structure. The first bypass structure may include a first portion having a first width and a second portion having a second width greater than the first width. The second portion of the first bypass structure may overlap with the first bit line in the vertical direction.

According to yet another aspect of one or more embodiments, an electronic system may include a main board; a semiconductor device on the main board; and a controller electrically connected to the semiconductor device on the main board. The semiconductor device may comprise a gate stack structure comprising insulating patterns and conductive patterns which are alternately stacked; a first separation structure penetrating the gate stack structure; a second separation structure penetrating the gate stack structure and being adjacent to the first separation structure; a first memory channel structure, a second memory channel structure and a third memory channel structure which penetrate the gate stack structure and are disposed between the first separation structure and the second separation structure; a first bit line overlapping with each of the first memory channel structure, the second memory channel structure, the third memory channel structure in a vertical direction, and electrically connected to the first memory channel structure; a second bit line overlapping with each of the first memory channel structure, the second memory channel structure, the third memory channel structure, and the first bit line in a vertical direction, and electrically connected to the second memory channel structure; a third bit line overlapping with each of the first memory channel structure, the second memory channel structure, and the third memory channel structure in the vertical direction, and electrically connected to the third memory channel structure; and a bypass structure electrically connecting the second bit line to the second memory channel structure. The third bit line is located at a same level as a level of the second bit line.

BRIEF DESCRIPTION OF THE DRAWINGS

FIG. 5A is a plan view illustrating a semiconductor device according to some embodiments.

DETAILED DESCRIPTION

Some example embodiments will now be described more fully with reference to the accompanying drawings.

Figure 1A:
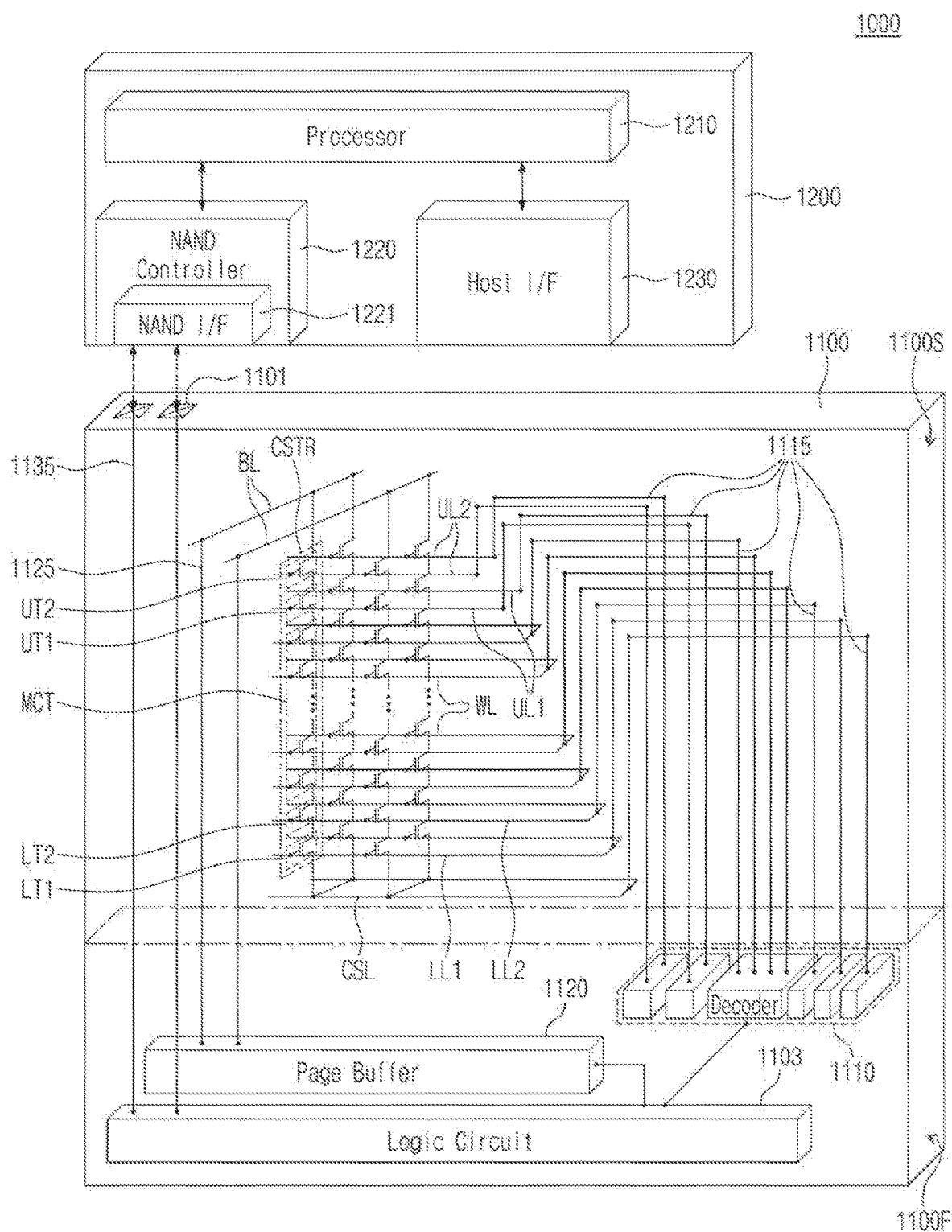
FIG. 1A is a schematic view illustrating an electronic system including a semiconductor device according to some embodiments.

FIG. 1A is a schematic view illustrating an electronic system including a semiconductor device according to some embodiments.

Referring to FIG. 1A, an electronic system 1000 according to some embodiments may include a semiconductor device 1100 and a controller 1200 electrically connected to the semiconductor device 1100. The electronic system 1000 may be a storage device including one or more semiconductor devices 1100, or an electronic device including the storage device. For example, the electronic system 1000 may be a solid state drive (SSD) device, a universal serial bus (USB) device, a computing system, a medical device or a communication device, which includes the one or more semiconductor devices 1100.

The semiconductor device 1100 may be a non-volatile memory device and may be, for example, a NAND flash memory device to be described later. The semiconductor device 1100 may include a first structure 1100F and a second structure 1100S on the first structure 1100F. In some embodiments, the first structure 1100F may be disposed at a side of the second structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR between the bit lines BL and the common source line CSL.

In the second structure 1100S each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed.

In some embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

The common source line CSL, the first and second gate lower lines LL1 and LL2, the word lines WL and the first and second gate upper lines UL1 and UL2 may be electrically connected to the decoder circuit 1110 through first connection lines 1115 extending from the first structure 1100F into the second structure 1100S. The bit lines BL may be electrically connected to the page buffer 1120 through second connection lines 1125 extending from the first structure 1100F into the second structure 1100S.

In the first structure 1100F, the decoder circuit 1110 and the page buffer 1120 may perform a control operation on at least one selected from the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 extending from the first structure 1100F into the second structure 1100S.

The controller 1200 may include a processor 1210, a NAND controller 1220, and a host interface 1230. In some embodiments, the electronic system 1000 may include a plurality of the semiconductor devices 1100, and in this case, the controller 1200 may control the plurality of semiconductor devices 1100.

The processor 1210 may control overall operations of the electronic system 1000 including the controller 1200. The processor 1210 may operate according to firmware and may control the NAND controller 1220 to access the semiconductor device 1100. The NAND controller 1220 may include a NAND interface 1221 for processing communication with the semiconductor device 1100. A control command for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the electronic system 1000 and an external host. When the control command is received from the external host through the host interface 1230, the processor 1210 may control the semiconductor device 1100 in response to the control command.

Figure 1B:
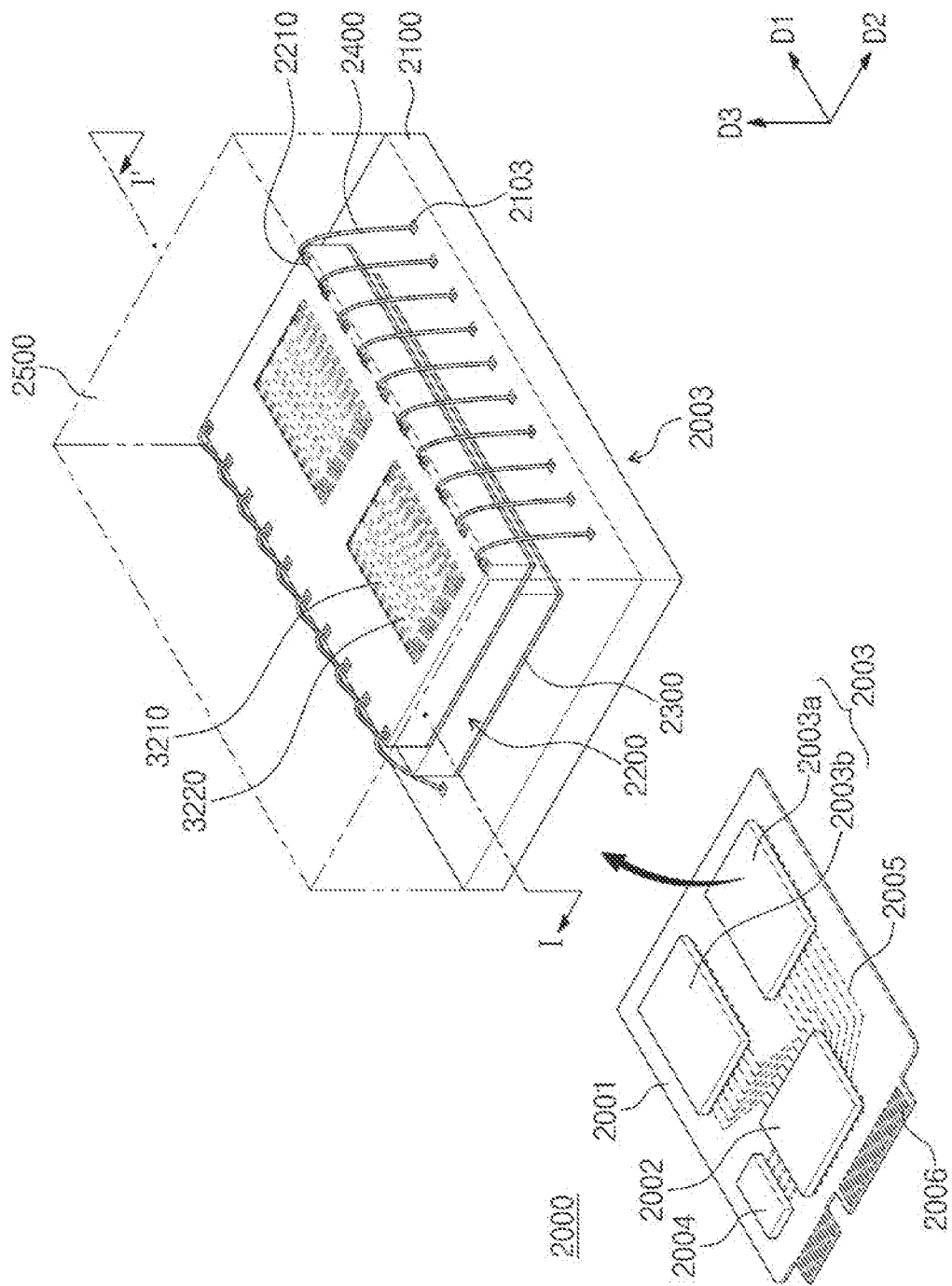
FIG. 1B is a perspective view schematically illustrating an electronic system including a semiconductor device according to some embodiments.

FIG. 1B is a perspective view schematically illustrating an electronic system including a semiconductor device according to some embodiments.

Referring to FIG. 1B, an electronic system 2000 according to some embodiments may include a main board 2001; and a controller 2002, one or more semiconductor packages 2003 and a DRAM 2004, which are mounted on the main board 2001. The semiconductor package 2003 and the DRAM 2004 may be connected to the controller 2002 through wiring patterns 2005 formed at the main board 2001.

The main board 2001 may include a connector 2006 including a plurality of pins coupled to an external host. The number and arrangement of the plurality of pins in the connector 2006 may be changed according to a communication interface between the electronic system 2000 and the external host. In some embodiments, the electronic system 2000 may communicate with the external host through one of a universal serial bus (USB) interface, a peripheral component interconnect express (PCI-express) interface, a serial advanced technology attachment (SATA) interface, and a M-Phy interface for an universal flash storage (UFS).

In some embodiments, the electronic system 2000 may operate by power supplied from the external host through the connector 2006. The electronic system 2000 may further include a power management integrated circuit (PMIC) for distributing the power supplied from the external host to the controller 2002 and the semiconductor package 2003.

The controller 2002 may write data in the semiconductor package 2003 and/or read data from the semiconductor package 2003 and may improve an operation speed of the electronic system 2000.

The DRAM 2004 may be a buffer memory for reducing a speed difference between the external host and the semiconductor package 2003 corresponding to a data storage space. The DRAM 2004 included in the electronic system 2000 may also operate as a cache memory and may provide a space for temporarily storing data in an operation of controlling the semiconductor package 2003. In the case in which the electronic system 2000 includes the DRAM 2004, the controller 2002 may further include a DRAM controller for controlling the DRAM 2004 in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 disposed on bottom surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 1A. Each of the semiconductor chips 2200 may include gate stack structures 3210 and memory channel structures 3220. Each of the semiconductor chips 2200 may include a semiconductor device to be described later.

In some embodiments, the connection structure 2400 may be a bonding wire electrically connecting the input/output pad 2210 to the package upper pad 2130. Thus, in each of the first and second semiconductor packages 2003a and 2003b, the semiconductor chips 2200 may be electrically connected to each other by the bonding wire method and may be electrically connected to the package upper pads 2130 of the package substrate 2100 by the bonding wire method. According to some embodiments, in each of the first and second semiconductor packages 2003a and 2003b, the semiconductor chips 2200 may be electrically connected to each other by a connection structure including a through-silicon via (TSV), instead of the connection structure 2400 having the bonding wire.

In some embodiments, the controller 2002 and the semiconductor chips 2200 may be included in a single package. For example, the controller 2002 and the semiconductor chips 2200 may be mounted on an interposer substrate different from the main board 2001, and the controller 2002 and the semiconductor chips 2200 may be connected to each other by wiring lines formed at the interposer substrate.

Figure 1C:
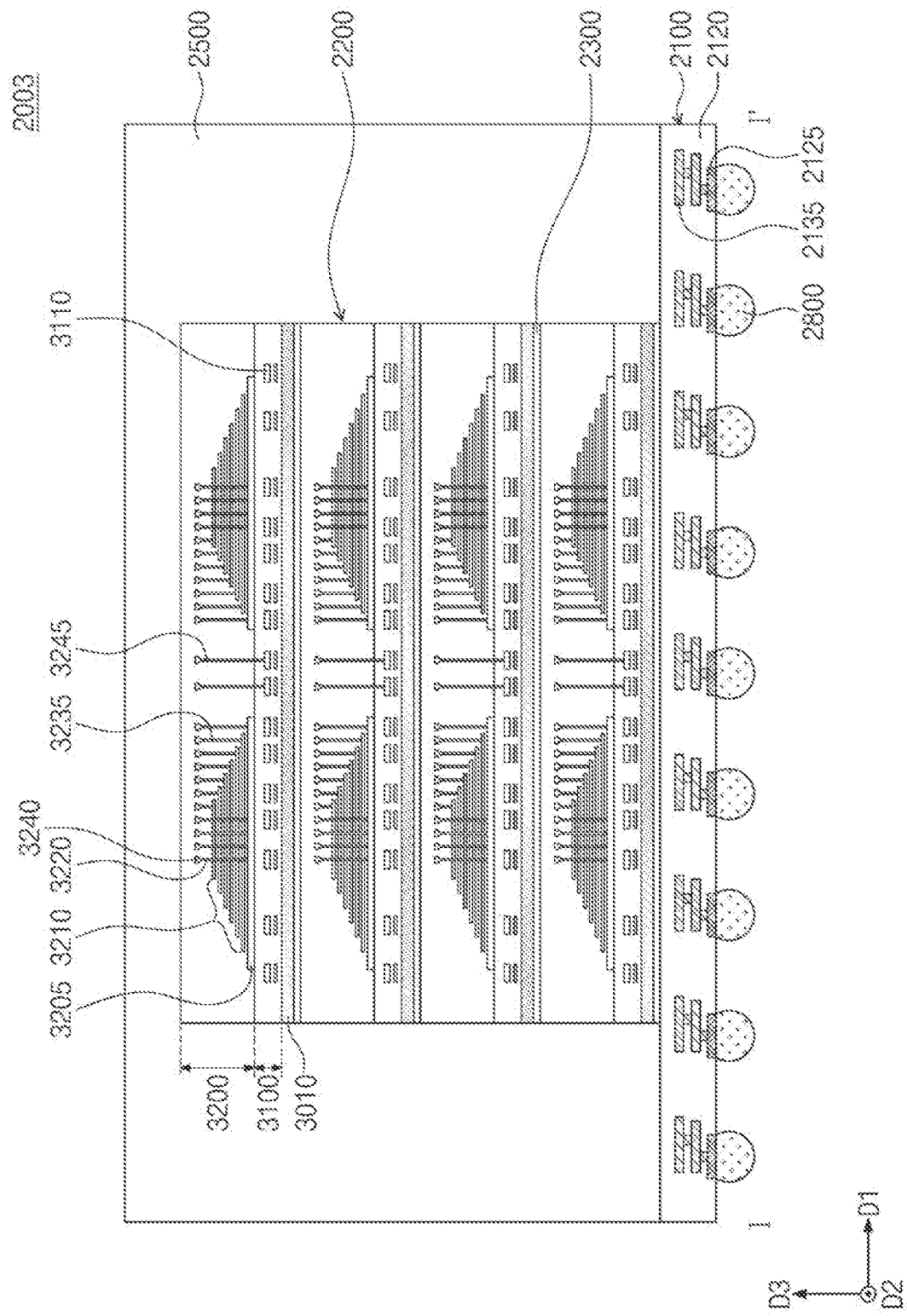
FIGS. 1C and 1D are cross-sectional views schematically illustrating semiconductor packages according to some embodiments.
Figure 1D:
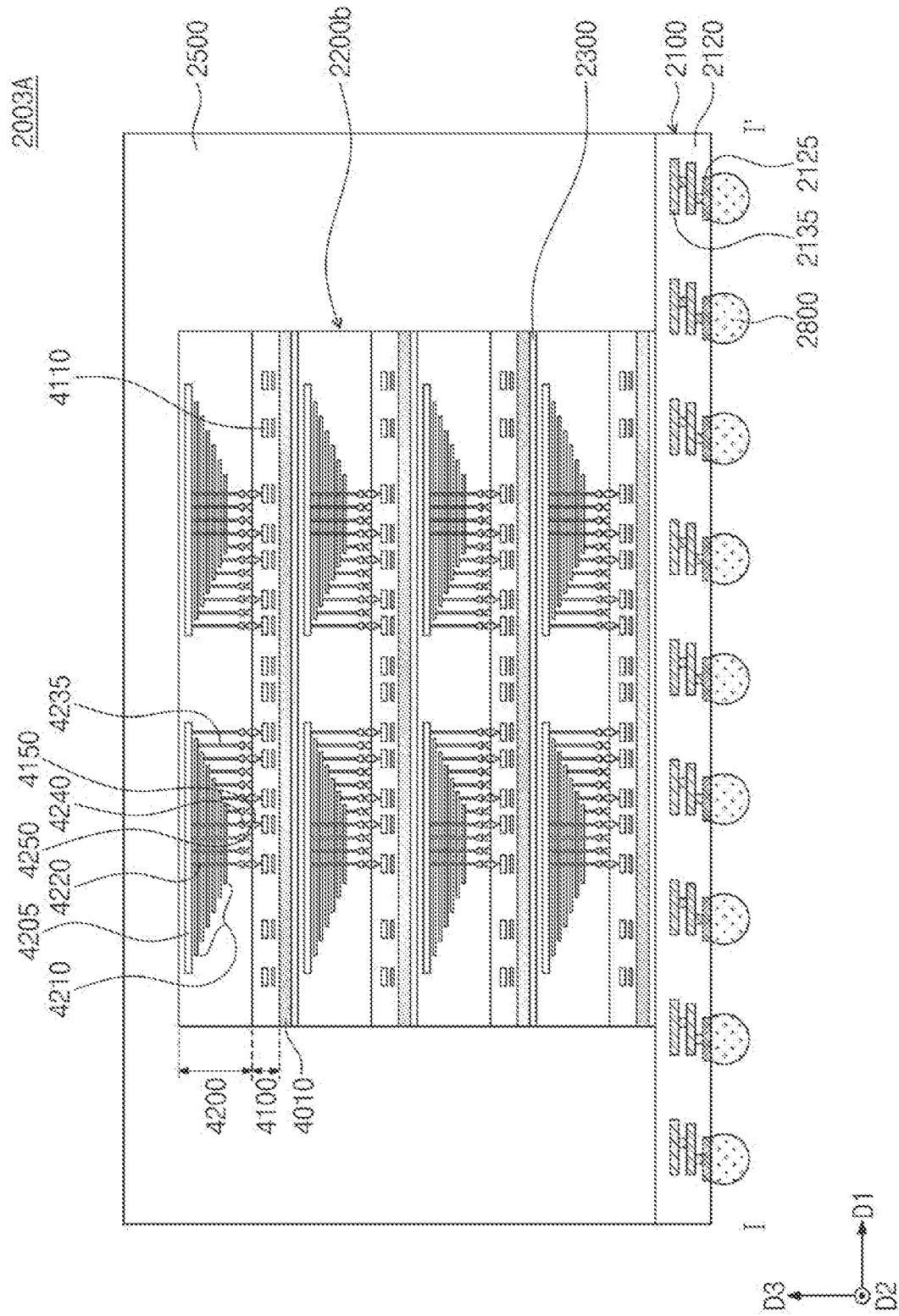

FIGS. 1C and 1D are cross-sectional views schematically illustrating semiconductor packages according to some embodiments. FIGS. 1C and 1D are cross-sectional views taken along a line IT of FIG. 1B to illustrate embodiments of the semiconductor package of FIG. 1B.

Referring to FIG. 1C, in the semiconductor package 2003, the package substrate 2100 may be a printed circuit board. The package substrate 2100 may include a package substrate body portion 2120, the package upper pads 2130 (see FIG. 1B) disposed on a top surface of the package substrate body portion 2120, package lower pads 2125 disposed on or exposed at a bottom surface of the package substrate body portion 2120, and internal wiring lines 2135 disposed in the package substrate body portion 2120 to electrically connect the package upper pads 2130 to the package lower pads 2125. The package upper pads 2130 may be electrically connected to the connection structures 2400 (see FIG. 1B). The package lower pads 2125 may be connected to the wiring patterns 2005 of the main board 2001 of the electronic system 2000 through conductive connection portions 2800, as illustrated in FIG. 1B.

Each of the semiconductor chips 2200 may include a semiconductor substrate 3010, and a first structure 3100 and a second structure 3200 which are sequentially stacked on the semiconductor substrate 3010. The first structure 3100 may include a peripheral circuit region including peripheral interconnection lines 3110. The second structure 3200 may include a common source line 3205, a gate stack structure 3210 on the common source line 3205, memory channel structures 3220 penetrating the gate stack structure 3210, bit lines 3240 electrically connected to the memory channel structures 3220, and gate contact plugs 3235 electrically connected to word lines WL (see FIG. 1A) of the gate stack structure 3210.

Each of the semiconductor chips 2200 may include a through-interconnection line 3245 which is electrically connected to the peripheral interconnection line 3110 of the first structure 3100 and extends into the second structure 3200. The through-interconnection line 3245 may be disposed outside the gate stack structure 3210. In some embodiments, the through-interconnection line 3245 may penetrate the gate stack structure 3210. Each of the semiconductor chips 2200 may further include the input/output pad 2210 (see FIG. 1B).

Referring to FIG. 1D, in a semiconductor package 2003A, each of semiconductor chips 2200b may include a semiconductor substrate 4010, a first structure 4100 on the semiconductor substrate 4010, and a second structure 4200 disposed on the first structure 4100 and bonded to the first structure 4100 by a wafer bonding method.

The first structure 4100 may include a peripheral circuit region including peripheral interconnection lines 4110 and first bonding structures 4150. The second structure 4200 may include a common source line 4205, a gate stack structure 4210 between the common source line 4205 and the first structure 4100, memory channel structures 4220 penetrating the gate stack structure 4210, bit lines 4240 electrically connected to the memory channel structures 4220, gate contact plugs 4235 electrically connected to word lines WL (see FIG. 1A) of the gate stack structure 4210, respectively, and second bonding structures 4250. For example, the second bonding structures 4250 may be electrically connected to the memory channel structures 4220 through the bit lines 4240 electrically connected to the memory channel structures 4220. The first bonding structures 4150 of the first structure 4100 may be bonded to the second bonding structures 4250 of the second structure 4200. For example, bonded portions of the first bonding structures 4150 and the second bonding structures 4250 may be formed of copper (Cu). Each of the semiconductor chips 2200b may further include the input/output pad 2210 (see FIG. 1B).

In some embodiments, the semiconductor chips 2200 of FIG. 1C or the semiconductor chips 2200b of FIG. 1D may be electrically connected to each other through the connection structures 2400 (see FIG. 1B) having the bonding wire shapes. In some embodiments, semiconductor chips (e.g., the semiconductor chips 2200 of FIG. 1C or the semiconductor chips 2200b of FIG. 1D) in a single semiconductor package may be electrically connected to each other through connection structures including through-silicon vias (TSV).

Figure 2A:
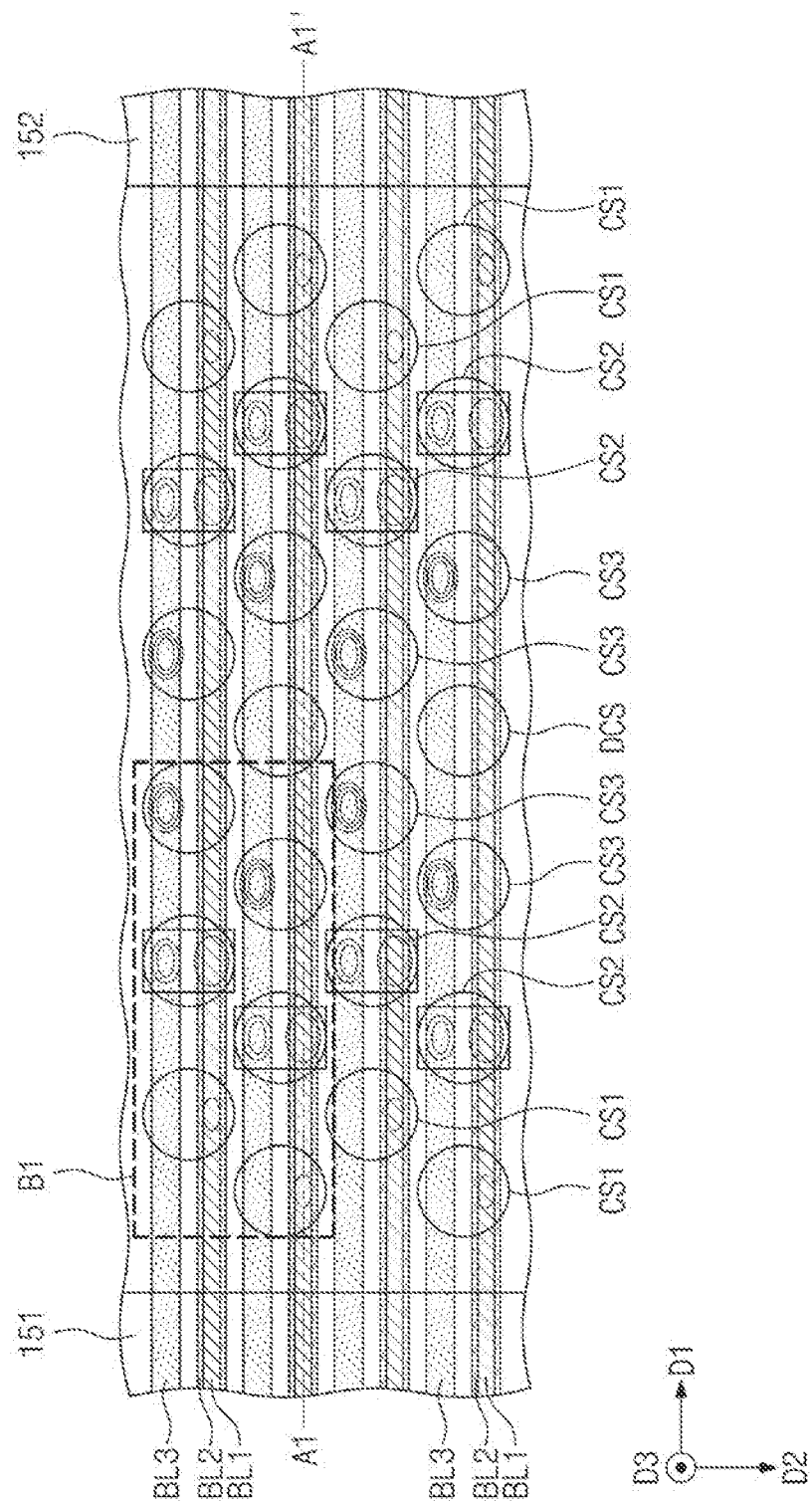
FIG. 2A is a plan view illustrating a semiconductor device according to some embodiments.
Figure 2B:
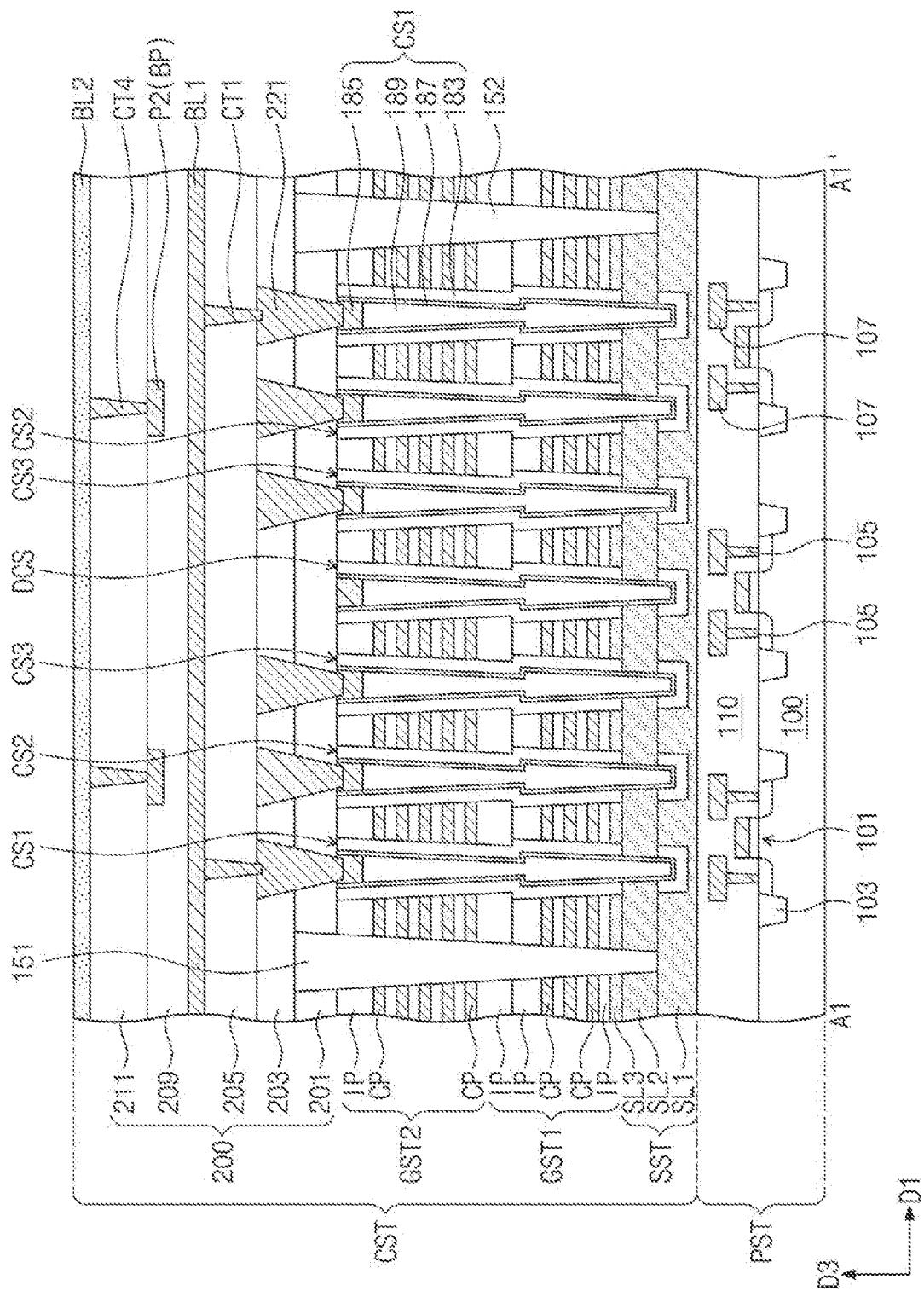
FIG. 2B is a cross-sectional view taken along a line A1-A1' of FIG. 2A.
Figure 2C:
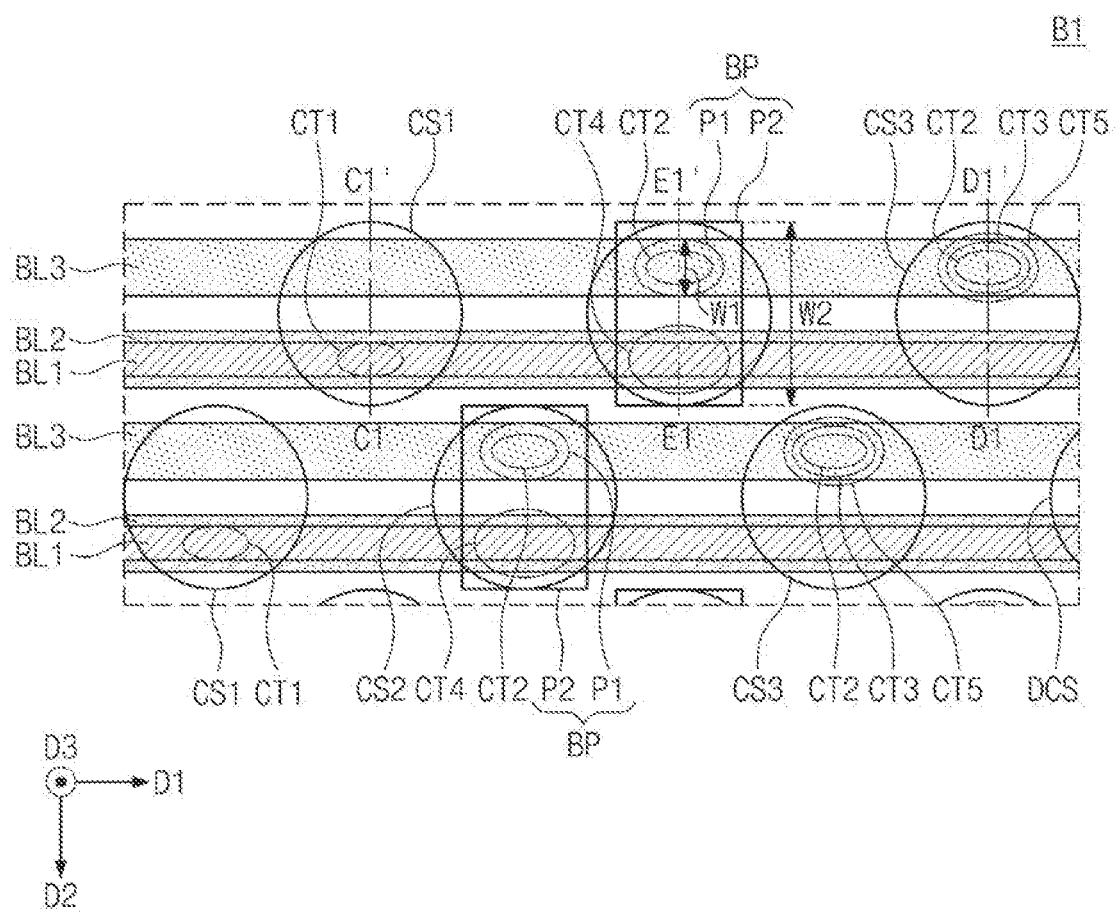
FIG. 2C is an enlarged view of a region 'B1' of FIG. 2A.
Figure 2D:
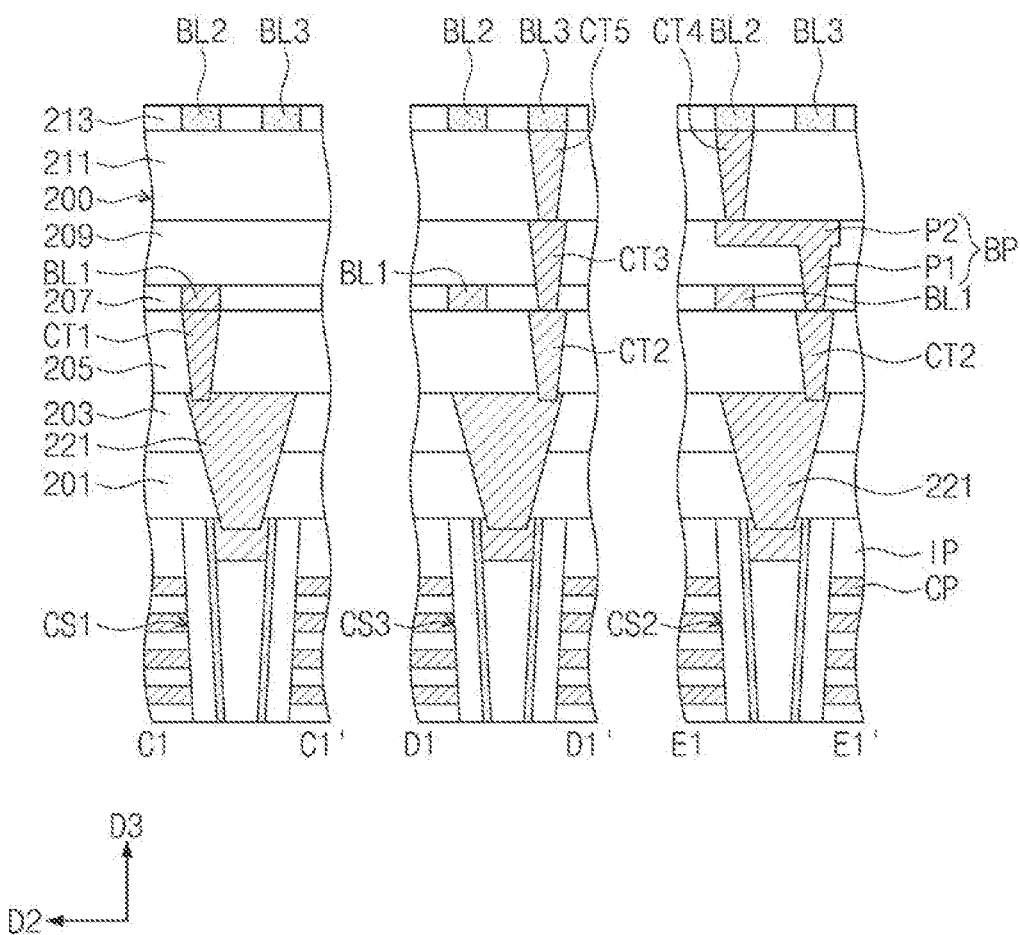
FIG. 2D is a cross-sectional view taken along lines C1-C1', D1-D1' and E1-E1' of FIG. 2C.

FIG. 2A is a plan view illustrating a semiconductor device according to some embodiments. FIG. 2B is a cross-sectional view taken along a line A1-A1' of FIG. 2A. FIG. 2C is an enlarged view of a region 'B1' of FIG. 2A. FIG. 2D is a cross-sectional view taken along lines C1-C1', D1-D1' and E1-E1' of FIG. 2C.

Referring to FIGS. 2A and 2B, a semiconductor device may include a peripheral circuit structure PST and a memory cell structure CST on the peripheral circuit structure PST.

The peripheral circuit structure PST may include a substrate 100. The substrate 100 may have a plate shape extending along a plane defined by a first direction D1 and a second direction D2. The first direction D1 and the second direction D2 may intersect each other. For example, the first direction D1 and the second direction D2 may be horizontal directions perpendicular to each other. In some embodiments, the substrate 100 may be a semiconductor substrate. For example, in some embodiments, the substrate 100 may include silicon, germanium, silicon-germanium, GaP, or GaAs. In some embodiments, the substrate 100 may be a silicon-on-insulator (SDI) substrate or a germanium-on-insulator (GOI) substrate.

The peripheral circuit structure PST may include a peripheral circuit insulating layer 110 on the substrate 100. The peripheral circuit insulating layer 110 may include an insulating material. For example, the peripheral circuit insulating layer 110 may include an oxide. In some embodiments, the peripheral circuit insulating layer 110 may be a multilayered insulating layer.

The peripheral circuit structure PST may further include a peripheral transistor 101. The peripheral transistor 101 may be provided between the substrate 100 and the peripheral circuit insulating layer 110. In some embodiments, the peripheral transistor 101 may include source/drain regions, a gate electrode, and a gate insulating layer. Device isolation layers 103 may be provided in the substrate 100. The peripheral transistor 101 may be disposed between the device isolation layers 103. The device isolation layer 103 may include an insulating material.

The peripheral circuit structure PST may further include peripheral contacts 105 and peripheral conductive lines 107. The peripheral contact 105 may be connected to the peripheral transistor 101 and/or the peripheral conductive line 107, and the peripheral conductive line 107 may be connected to the peripheral contact 105. The peripheral contact 105 and the peripheral conductive line 107 may be provided in the peripheral circuit insulating layer 110. The peripheral contact 105 and the peripheral conductive line 107 may include a conductive material.

The memory cell structure CST may include a source structure SST, a first gate stack structure GST1, a second gate stack structure GST2, first memory channel structures CS1, second memory channel structures CS2, third memory channel structures CS3, dummy channel structures DCS, a connection structure 200, a first separation structure 151, and a second separation structure 152.

The source structure SST may include a first source layer SL1 on the peripheral circuit structure PST, a second source layer SL2 on the first source layer SL1, and a third source layer SL3 on the second source layer SL2.

The first to third source layers SL1, SL2 and SL3 may include a conductive material. For example, the first to third source layers SL1, SL2 and SL3 may include poly-silicon. The second source layer SL2 may be a common source line.

The first gate stack structure GST1 may be provided on the source structure SST. The first gate stack structure GST1 may include insulating patterns IP and conductive patterns CP, which are alternately stacked in a third direction D3. The third direction D3 may intersect the first direction D1 and the second direction D2. For example, the third direction D3 may be a vertical direction perpendicular to the first direction D1 and the second direction D2.

The second gate stack structure GST2 may be provided on the first gate stack structure GST1. The second gate stack structure GST2 may include insulating patterns IP and conductive patterns CP, which are alternately stacked in the third direction D3.

The insulating patterns IP may include an insulating material. For example, the insulating patterns IP may include an oxide. The conductive patterns CP may include a conductive material. For example, the conductive patterns CP may include tungsten.

The number of the gate stack structures GST1 and GST2 is not limited to FIG. 2B. In some embodiments, the number of the gate stack structures GST1 and GST2 may be 3 or more.

The numbers of the insulating patterns IP and the conductive patterns CP in the first gate stack structure GST1 and the numbers of the insulating patterns IP and the conductive patterns CP in the second gate stack structure GST2 are not limited to those illustrated in FIG. 2B.

The first memory channel structures CS1, the second memory channel structures CS2, the third memory channel structures CS3 and the dummy channel structures DCS may extend in the third direction D3 to penetrate the insulating patterns IP and the conductive patterns CP of the first gate stack structure GST1, the insulating patterns IP and the conductive patterns CP of the second gate stack structure GST2, and the third source layer SL3 and the second source layer SL2 of the source structure SST.

Each of the first memory channel structures CS1, the second memory channel structures CS2, the third memory channel structures CS3 and the dummy channel structures DCS may include an insulating capping layer 189, a channel layer 187 surrounding the insulating capping layer 189, and a memory layer 183 surrounding the channel layer 187. It is noted that, in FIG. 2B, the insulating capping layer 189, the channel layer 187, and the memory layer 183 are illustrated with respect to the first memory channel structures CS1. However, the second memory channel structures CS2, the third memory channel structures CS3 and the dummy channel structures DCS have similar structures to the first memory channel structures CS1, and thus repeated description thereof is omitted for conciseness.

The insulating capping layer 189 may include an insulating material. For example, the insulating capping layer 189 may include an oxide. The channel layer 187 may include a conductive material. For example, the channel layer 187 may include poly-silicon. The channel layer 187 may be electrically connected to the second source layer SL2. The second source layer SL2 may penetrate the memory layer 183 so as to be connected to the channel layer 187.

The memory layer 183 may be capable of storing data. In some embodiments, the memory layer 183 may include a tunnel insulating layer surrounding the channel layer 187, a data storing layer surrounding the tunnel insulating layer, and a blocking layer surrounding the data storing layer.

Each of the first memory channel structures CS1, the second memory channel structures CS2, the third memory channel structures CS3 and the dummy channel structures DCS may further include a bit line pad 185 provided on the channel layer 187. The bit line pad 185 may include a conductive material. For example, the bit line pad 185 may include poly-silicon or a metal.

The first and second separation structures 151 and 152 may extend in the third direction D3 to penetrate the first and second gate stack structures GST1 and GST2. The first and second separation structures 151 and 152 may extend in the second direction D2. The first and second separation structures 151 and 152 may be spaced apart from each other in the first direction D1. The first and second separation structures 151 and 152 may be separation structures adjacent to each other. The first and second separation structures 151 and 152 may include an insulating material. In some embodiments, the first and second separation structures 151 and 152 may further include a conductive material in the insulating material.

The first memory channel structures CS1, the second memory channel structures CS2, the third memory channel structures CS3 and the dummy channel structures DCS may be disposed between the first separation structure 151 and the second separation structure 152.

A distance between the first memory channel structure CS1 and the dummy channel structure DCS may be greater than a distance between the second memory channel structure CS2 and the dummy channel structure DCS. The distance between the second memory channel structure CS2 and the dummy channel structure DCS may be greater than a distance between the third memory channel structure CS3 and the dummy channel structure DCS.

The arrangement of the first to third memory channel structures CS1, CS2 and CS3 is not limited to the arrangement illustrated in FIGS. 2A and 2B. In some embodiments, the distance between the first memory channel structure CS1 and the dummy channel structure DCS may be less than the distance between the second memory channel structure CS2 and the dummy channel structure DCS, and the distance between the second memory channel structure CS2 and the dummy channel structure DCS may be less than the distance between the third memory channel structure CS3 and the dummy channel structure DCS.

Referring to FIGS. 2A, 2B, 2C and 2D, the connection structure 200 may include a first insulating layer 201, a second insulating layer 203 on the first insulating layer 201, a third insulating layer 205 on the second insulating layer 203, a fourth insulating layer 207 on the third insulating layer 205, a fifth insulating layer 209 on the fourth insulating layer 207, a sixth insulating layer 211 on the fifth insulating layer 209, a seventh insulating layer 213 on the sixth insulating layer 211, stud contacts 221 penetrating the first and second insulating layers 201 and 203, first contacts CT1 and second contacts CT2 which penetrate the third insulating layer 205, first bit lines BL1 in the fourth insulating layer 207, third contacts CT3 and bypass structures BP which penetrate the fourth and fifth insulating layers 207 and 209, fourth contacts CT4 and fifth contacts CT5 which penetrate the sixth insulating layer 211, and second bit lines BL2 and third bit lines BL3 in the seventh insulating layer 213. Each of the memory channel structures CS1, CS2 and CS3 may overlap with the first to third bit lines BL1, BL2 and BL3 in the third direction D3. The first to third bit lines BL1, BL2 and BL3 may extend in the first direction D1. The first and third bit lines BL1 and BL3 may be alternately arranged in the second direction D2 when viewed in a plan view. The second and third bit lines BL2 and BL3 may be alternately arranged in the second direction D2. Each of the first bit line BL1, the second bit line BL2 and the third bit line BL3 may overlap with the first to third memory channel structures CS1, CS2 and CS3, arranged in the first direction D1, in the third direction D3.

The first to seventh insulating layers 201, 203, 205, 207, 209, 211 and 213 may include an insulating material. For example, the first to seventh insulating layers 201, 203, 205, 207, 209, 211 and 213 may include an oxide.

Each of the stud contacts 221 may be connected to the first memory channel structure CS1, the second memory channel structure CS2 or the third memory channel structure CS3. The stud contact 221 may include a conductive material.

Each of the first contact CT1 and the second contact CT2 may be connected to the stud contact 221. The first contact CT1 and the second contact CT2 may be located at the same level. Top surfaces of the first contact CT1 and the second contact CT2 may be coplanar with each other. The first contact CT1 may overlap with the first bit line BL1 and the second bit line BL2 in the third direction D3. The second contact CT2 may overlap with the third bit line BL3 in the third direction D3. The first contact CT1 may be connected to the first bit line BL1. The first contact CT1 may be electrically connected to the first memory channel structure CS1. The second contact CT2 may be electrically connected to the second memory channel structure CS2 or the third memory channel structure CS3. The first and second contacts CT1 and CT2 may include a conductive material.

The first bit line BL1 may be electrically connected to the first memory channel structure CS1 through the first contact CT1 and a corresponding one of the stud contacts 221. The first bit line BL1 may be electrically isolated from the second memory channel structure CS2 and the third memory channel structure CS3. The first bit line BL1 may overlap with the second bit line BL2 in the third direction D3. The first bit line BL1 may overlap with the first to third memory channel structures CS1, CS2 and CS3, the dummy channel structure DCS, the first separation structure 151 and the second separation structure 152 in the third direction D3. The first bit line BL1 may include a conductive material.

The third contact CT3 may be connected to a corresponding one of the second contacts CT2. A lower portion of the third contact CT3 may be located at the same level as the first bit line BL1. The third contact CT3 may be located at the same level as the bypass structure BP. A top surface of the third contact CT3 may be coplanar with a top surface of the bypass structure BP. The third contact CT3 may overlap with the third bit line BL3 and the second contact CT2 in the third direction D3. The third contact CT3 may be electrically connected to the third memory channel structure CS3. The third contact CT3 may include a conductive material.

The bypass structure BP may include a first portion P1 and a second portion P2 on the first portion P1. A width of the second portion P2 of the bypass structure BP may be greater than a width of the first portion P1 of the bypass structure BP (see, e.g., FIG. 2C). For example, a width W2, in the second direction D2, of the second portion P2 of the bypass structure BP may be greater than a width W1, in the second direction D2, of the first portion P1 of the bypass structure BP.

The first portion P1 of the bypass structure BP may be connected to a corresponding one of the second contacts CT2. At least a portion of the first portion P1 of the bypass structure BP may be located at the same level as the first bit line BL1. For example, a lower portion of the first portion P1 of the bypass structure BP may be located at the same level as the first bit line BL1. The second portion P2 of the bypass structure BP may be located at a higher level than the first bit line BL1. A bottom surface of the second portion P2 of the bypass structure BP may face a top surface of the first bit line BL1.

A top surface of the second portion P2 of the bypass structure BP may be coplanar with a top surface of the third contact CT3. The first portion P1 of the bypass structure BP may overlap with the second contact CT2 in the third direction D3. The second portion P2 of the bypass structure BP may include a portion overlapping with the first bit line BL1, the second bit line BL2 and the fourth contact CT4 in the third direction D3, and a portion overlapping with the second contact CT2, the first portion P1 of the bypass structure BP and the third bit line BL3 in the third direction D3.

The second portion P2 of the bypass structure BP may be connected to the fourth contact CT4. The bypass structure BP may be electrically connected to the second bit line BL2 and the second memory channel structure CS2. The bypass structure BP may include a conductive material.

The fourth contact CT4 may be connected to the second portion P2 of the bypass structure BP. The fourth contact CT4 may overlap with the second bit line BL2, the first bit line BL1 and the second portion P2 of the bypass structure BP in the third direction D3. The fourth contact CT4 may be electrically connected to the second memory channel structure CS2. The fourth contact CT4 may include a conductive material.

The fifth contact CT5 may be connected to the third contact CT3. The fifth contact CT5 may be located at the same level as the fourth contact CT4. A top surface of the fifth contact CT5 may be coplanar with a top surface of the fourth contact CT4. The fifth contact CT5 may overlap with the third bit line BL3, the third contact CT3 and the second contact CT2 in the third direction D3. The fifth contact CT5 may be electrically connected to the third memory channel structure CS3. The fifth contact CT5 may include a conductive material.

The second bit line BL2 may be electrically connected to the second memory channel structure CS2 through the fourth contact CT4, the bypass structure BP, the corresponding second contact CT2 and a corresponding stud contact 221. The second bit line BL2 may be electrically isolated from the first memory channel structure CS1 and the third memory channel structure CS3. The second bit line BL2 may overlap with the first bit line BL1 in the third direction D3. The second bit line BL2 may overlap with the first to third memory channel structures CS1, CS2 and CS3, the dummy channel structure DCS, the first separation structure 151 and the second separation structure 152 in the third direction D3. The second bit line BL2 may include a conductive material.

The third bit line BL3 may be electrically connected to the third memory channel structure CS3 through the fifth contact CT5, the third contact CT3, the corresponding second contact CT2 and a corresponding stud contact 221. The third bit line BL3 may be electrically isolated from the first memory channel structure CS1 and the second memory channel structure CS2. The third bit line BL3 may overlap with the first to third memory channel structures CS1, CS2 and CS3, the dummy channel structure DCS, the first separation structure 151 and the second separation structure 152 in the third direction D3. The third bit line BL3 may include a conductive material.

However, embodiments are not limited to the illustrated arrangement of a first channel connection structure including the first memory channel structure CS1, the stud contact 221 and the first contact CT1 which are connected to each other, a second channel connection structure including the second memory channel structure CS2, the stud contact 221, the second contact CT2, the bypass structure BP and the fourth contact CT4 which are connected to each other, and a third channel connection structure including the third memory channel structure CS3, the stud contact 221, the second contact CT2, the third contact CT3 and the fifth contact CT5 which are connected to each other. In some embodiments, the third channel connection structure may be farthest from the dummy channel structure DCS, and the first channel connection structure may be closest to the dummy channel structure DCS. In some embodiments, the third channel connection structure may be farthest from the dummy channel structure DCS, and the second channel connection structure may be closest to the dummy channel structure DCS. In some embodiments, the first channel connection structure may be farthest from the dummy channel structure DCS, and the second channel connection structure may be closest to the dummy channel structure DCS. In some embodiments, the second channel connection structure may be farthest from the dummy channel structure DCS, and the third channel connection structure may be closest to the dummy channel structure DCS. In some embodiments, the second channel connection structure may be farthest from the dummy channel structure DCS, and the first channel connection structure may be closest to the dummy channel structure DCS.

Since the semiconductor device according to the embodiments described above includes the first and second bit lines BL1 and BL2 overlapping with each other and the bypass structure BP, a density of the memory channel structures CS1, CS2 and CS3 between the first and second separation structures 151 and 152 adjacent to each other may relatively increase, and an integration density of the semiconductor device may be improved.

Figure 3A:
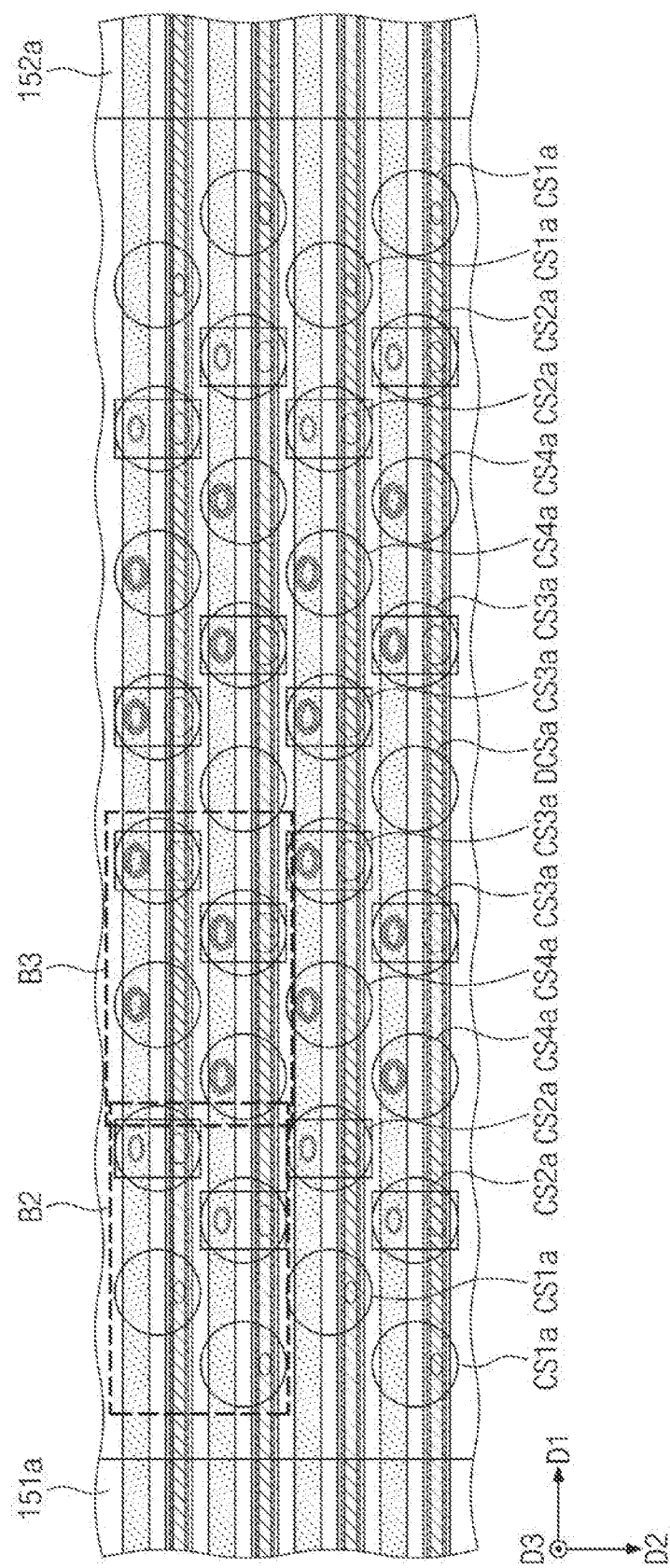
FIG. 3A is a plan view illustrating a semiconductor device according to some embodiments.
Figure 3B:
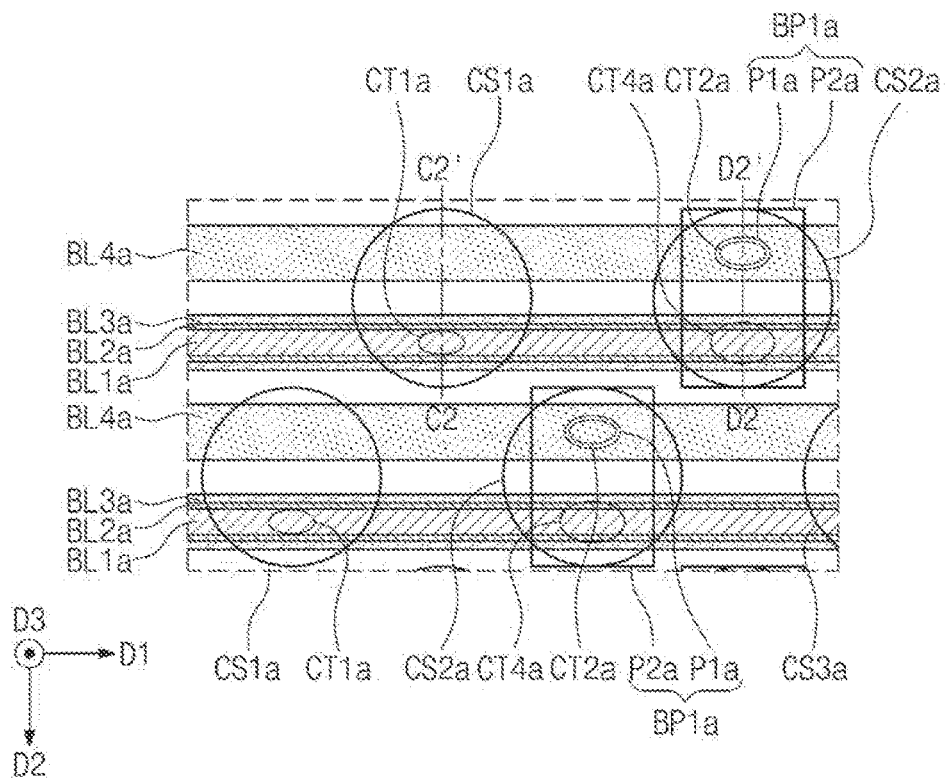
FIG. 3B is an enlarged view of a region 'B2' of FIG. 3A.
Figure 3C:
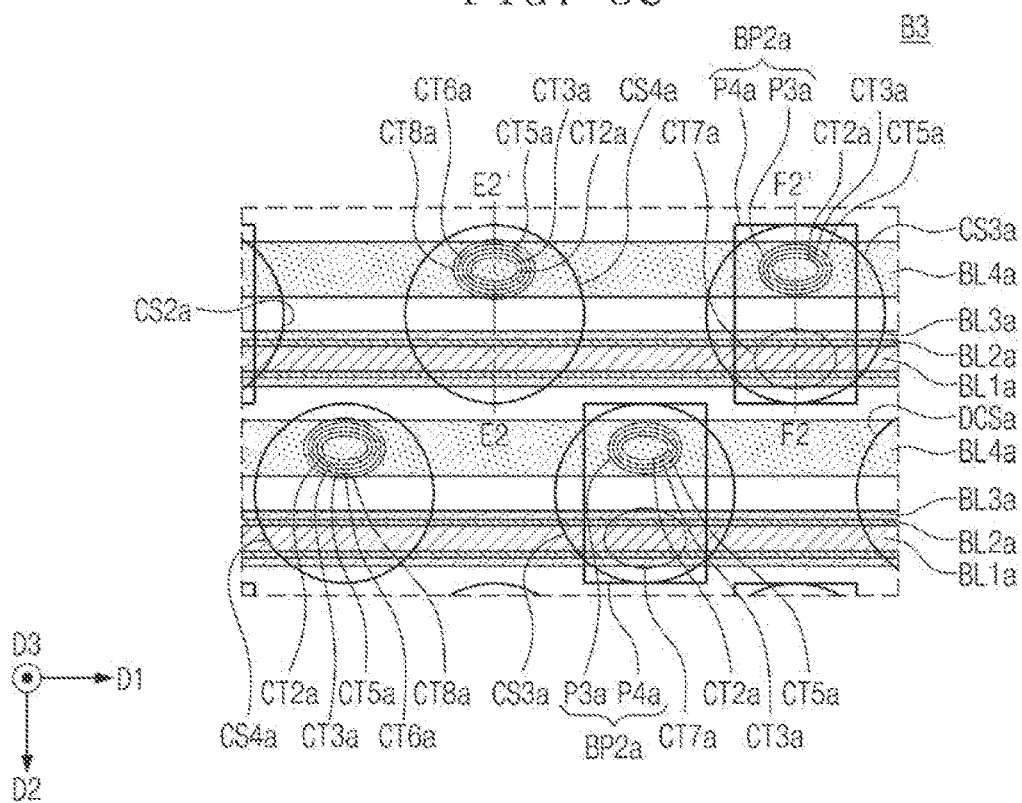
FIG. 3C is an enlarged view of a region 'B3' of FIG. 3A.
Figure 3D:
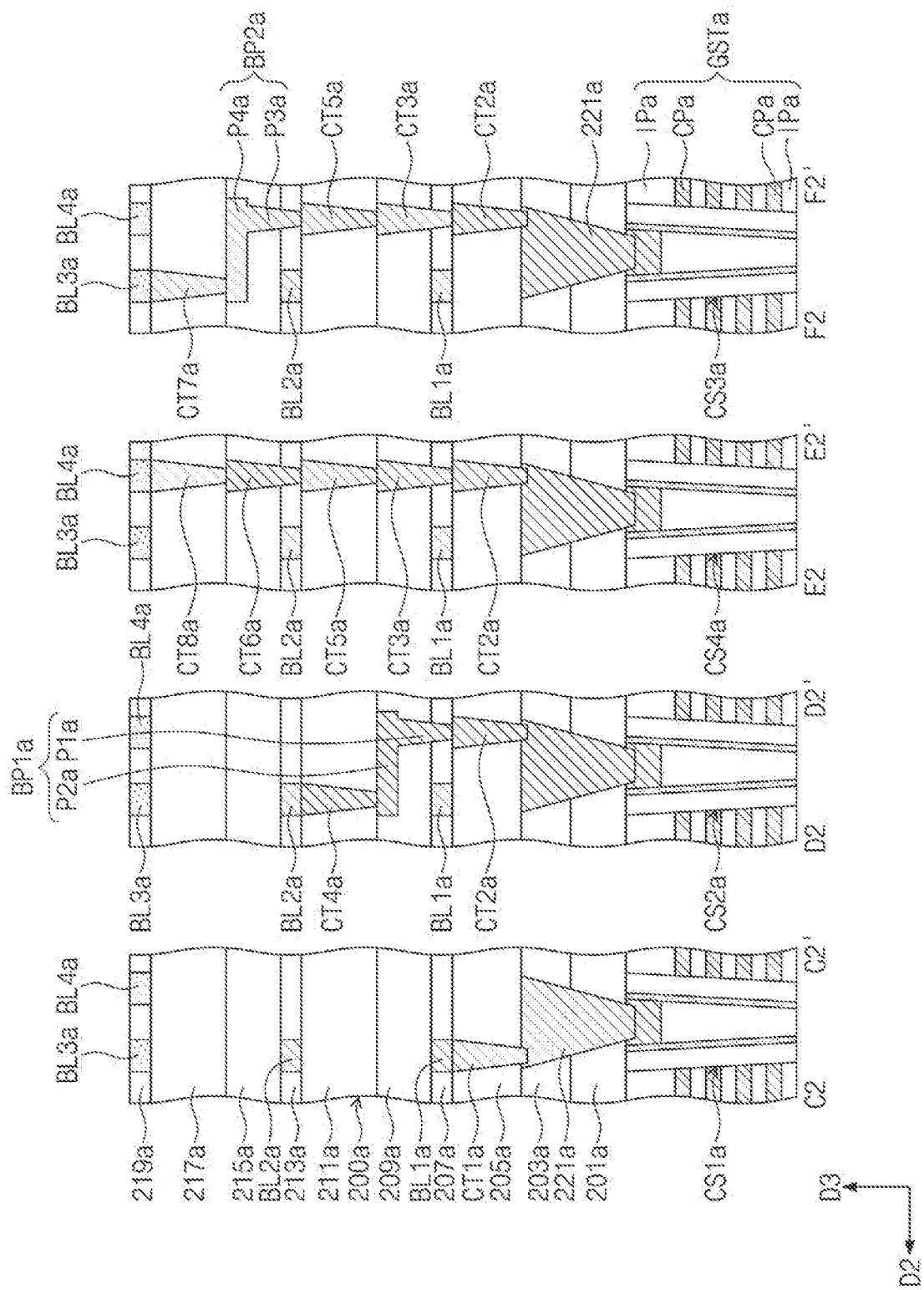
FIG. 3D is a cross-sectional view taken along lines C2-C2', D2-D2', E2-E2' and F2-F2' of FIGS. 3B and 3C.

FIG. 3A is a plan view illustrating a semiconductor device according to some embodiments. FIG. 3B is an enlarged view of a region 'B2' of FIG. 3A. FIG. 3C is an enlarged view of a region 'B3' of FIG. 3A. FIG. 3D is a cross-sectional view taken along lines C2-C2', D2-D2', E2-E2' and F2-F2' of FIGS. 3B and 3C.

Referring to FIGS. 3A, 3B, 3C and 3D, a semiconductor device may include a gate stack structure GSTa, first memory channel structures CS1a, second memory channel structures CS2a, third memory channel structures CS3a, fourth memory channel structures CS4a, dummy channel structures DCSa, a connection structure 200a, a first separation structure 151a, and a second separation structure 152a.

The gate stack structure GSTa may include insulating patterns IPa and conductive patterns CPa. The first and second separation structures 151a and 152a may extend in the third direction D3 to penetrate the gate stack structure GSTa. The first and second separation structures 151a and 152a may be separation structures adjacent to each other.

The first memory channel structures CS1a, the second memory channel structures CS2a, the third memory channel structures CS3a, the fourth memory channel structures CS4a and the dummy channel structures DCSa may be disposed between the first separation structure 151a and the second separation structure 152a.

The connection structure 200a may include a first insulating layer 201a, a second insulating layer 203a on the first insulating layer 201a, a third insulating layer 205a on the second insulating layer 203a, a fourth insulating layer 207a on the third insulating layer 205a, a fifth insulating layer 209a on the fourth insulating layer 207a, a sixth insulating layer 211a on the fifth insulating layer 209a, a seventh insulating layer 213a on the sixth insulating layer 211a, an eighth insulating layer 215a on the seventh insulating layer 213a, a ninth insulating layer 217a on the eighth insulating layer 215a, a tenth insulating layer 219a on the ninth insulating layer 217a, stud contacts 221a penetrating the first and second insulating layers 201a and 203a, first contacts CT1a and second contacts CT2a which penetrate the third insulating layer 205a, first bit lines BL1a in the fourth insulating layer 207a, third contacts CT3a and first bypass structures BP1a which penetrate the fourth and fifth insulating layers 207a and 209a, fourth contacts CT4a and fifth contacts CT5a which penetrate the sixth insulating layer 211a, second bit lines BL2a in the seventh insulating layer 213a, sixth contacts CT6a and second bypass structures BP2a which penetrate the seventh and eighth insulating layers 213a and 215a, seventh contacts CT7a and eighth contacts CT8a which penetrate the ninth insulating layer 217a, and third bit lines BL3a and fourth bit lines BL4a in the tenth insulating layer 219a. The first to fourth bit lines BL1a, BL2a, BL3a and BL4a may overlap with each of the memory channel structure CS1a, CS2a, CS3a and CS4a in the third direction D3. Each of the first bit line BL1a, the second bit line BL2a, the third bit line BL3a and the fourth bit line BL4a may overlap with the first to fourth memory channel structures CS1a, CS2a, CS3a and CS4a, arranged in the first direction D1, in the third direction D3.

The stud contacts 221a may be connected to the first to fourth memory channel structures CS1a, CS2a, CS3a and CS4a, respectively.

The first bit line BL1a may be electrically connected to the first memory channel structure CS1a through the first contact CT1a and a corresponding one of the stud contacts 221a. The second bit line BL2a may be electrically connected to the second memory channel structure CS2a through the fourth contact CT4a, the first bypass structure BP1a, a corresponding one of the second contacts CT2a and a corresponding one of the stud contacts 221a. The fourth bit line BL4a may be electrically connected to the fourth memory channel structure CS4a through the eighth contact CT8a, the sixth contact CT6a, a corresponding one of the fifth contacts CT5a, a corresponding one of the third contacts CT3a, a corresponding one of the second contacts CT2a and a corresponding one of the stud contacts 221a. The third bit line BL3a may be electrically connected to the third memory channel structure CS3a through the seventh contact CT7a, the second bypass structure BP2a, a corresponding one of the fifth contacts CT5a, a corresponding one of the third contacts CT3a, a corresponding one of the second contacts CT2a and a corresponding one of the stud contacts 221a.

The first bypass structure BP1a may include a first portion P1a and a second portion P2a having a width greater than that of the first portion P1a. The second bypass structure BP2a may include a first portion P3a and a second portion P4a having a width greater than that of the first portion P3a.

The first to third bit lines BL1a, BL2a and BL3a may overlap with each other in the third direction D3. The second portion P2a of the first bypass structure BP1a may overlap with the first to fourth bit lines BL1a, BL2a, BL3a and BL4a in the third direction D3. The second portion P4a of the second bypass structure BP2a may overlap with the first to third bit lines BL1a, BL2a and BL3a in the third direction D3. The first portion P1a of the first bypass structure BP1a may overlap with the fourth bit line BL4a. The first portion P3a of the second bypass structure BP2a may overlap with the fourth bit line BL4a.

The second bit line BL2a may be located at a higher level than the first bit line BL1a. The third and fourth bit lines BL3a and BL4a may be located at a higher level than the second bit line BL2a. The second portion P2a of the first bypass structure BP1a may be located at a higher level than the first bit line BL1a and may be located at a lower level than the second bit line BL2a. The second portion P4a of the second bypass structure BP2a may be located at a higher level than the second bit line BL2a and may be located at a lower level than the third and fourth bit lines BL3a and BL4a.

However, embodiments are not limited to the illustrated arrangement of a first channel connection structure including the first memory channel structure CS1a, the stud contact 221a and the first contact CT1a which are connected to each other, a second channel connection structure including the second memory channel structure CS2a, the stud contact 221a, the second contact CT2a, the first bypass structure BP1a and the fourth contact CT4a which are connected to each other, a third channel connection structure including the third memory channel structure CS3a, the stud contact 221a, the second contact CT2a, the third contact CT3a, the fifth contact CT5a, the second bypass structure BP2a and the seventh contact CT7a which are connected to each other, and a fourth channel connection structure including the fourth memory channel structure CS4a, the stud contact 221a, the second contact CT2a, the third contact CT3a, the fifth contact CT5a, the sixth contact CT6a and the eighth contact CT8a which are connected to each other. In some embodiments, the first channel connection structure may be closest to the dummy channel structure DCSa, and the fourth channel connection structure may be farthest from the dummy channel structure DCSa.

Figure 4A:
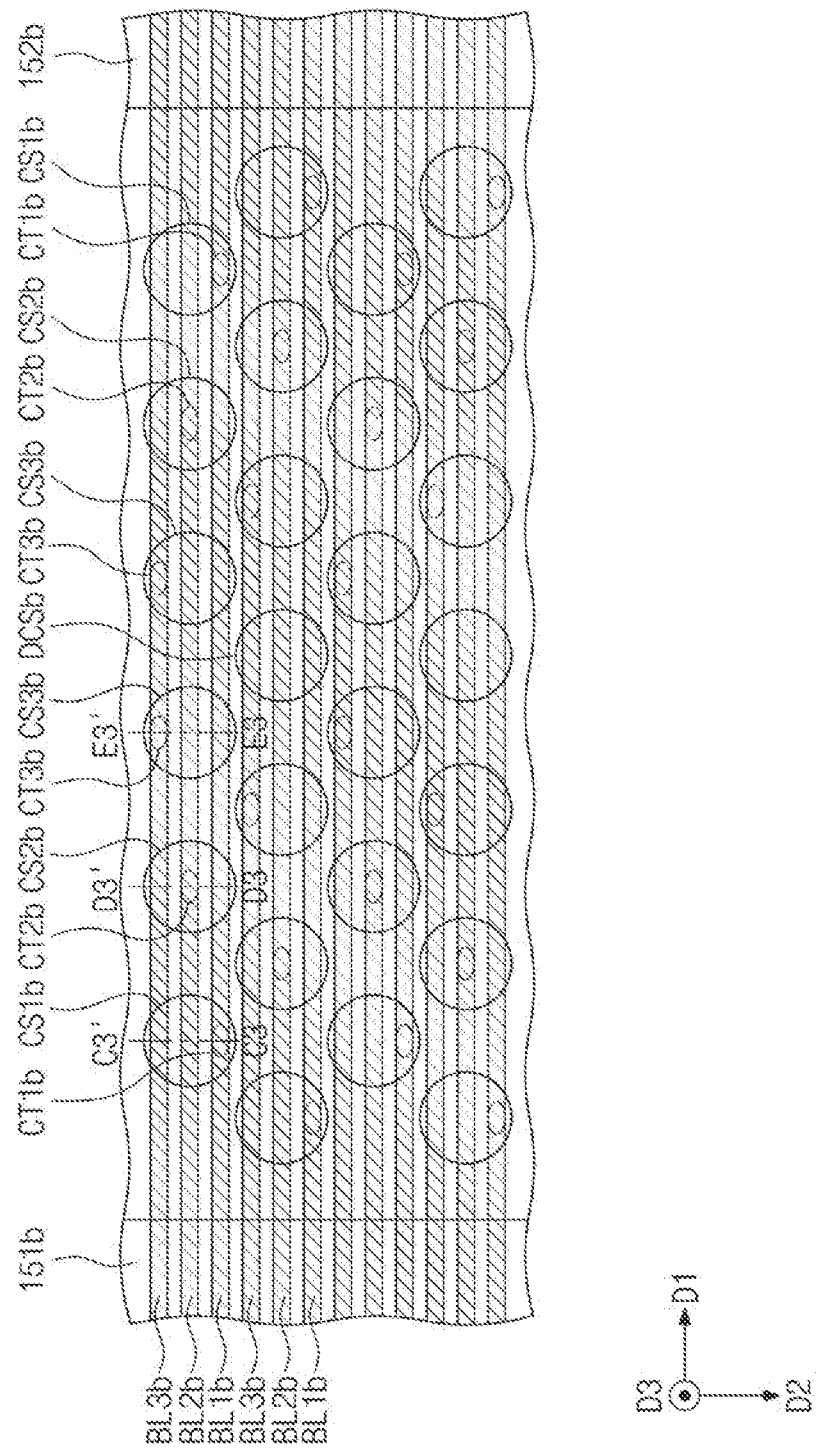
FIG. 4A is a plan view illustrating a semiconductor device according to some embodiments.
Figure 4B:
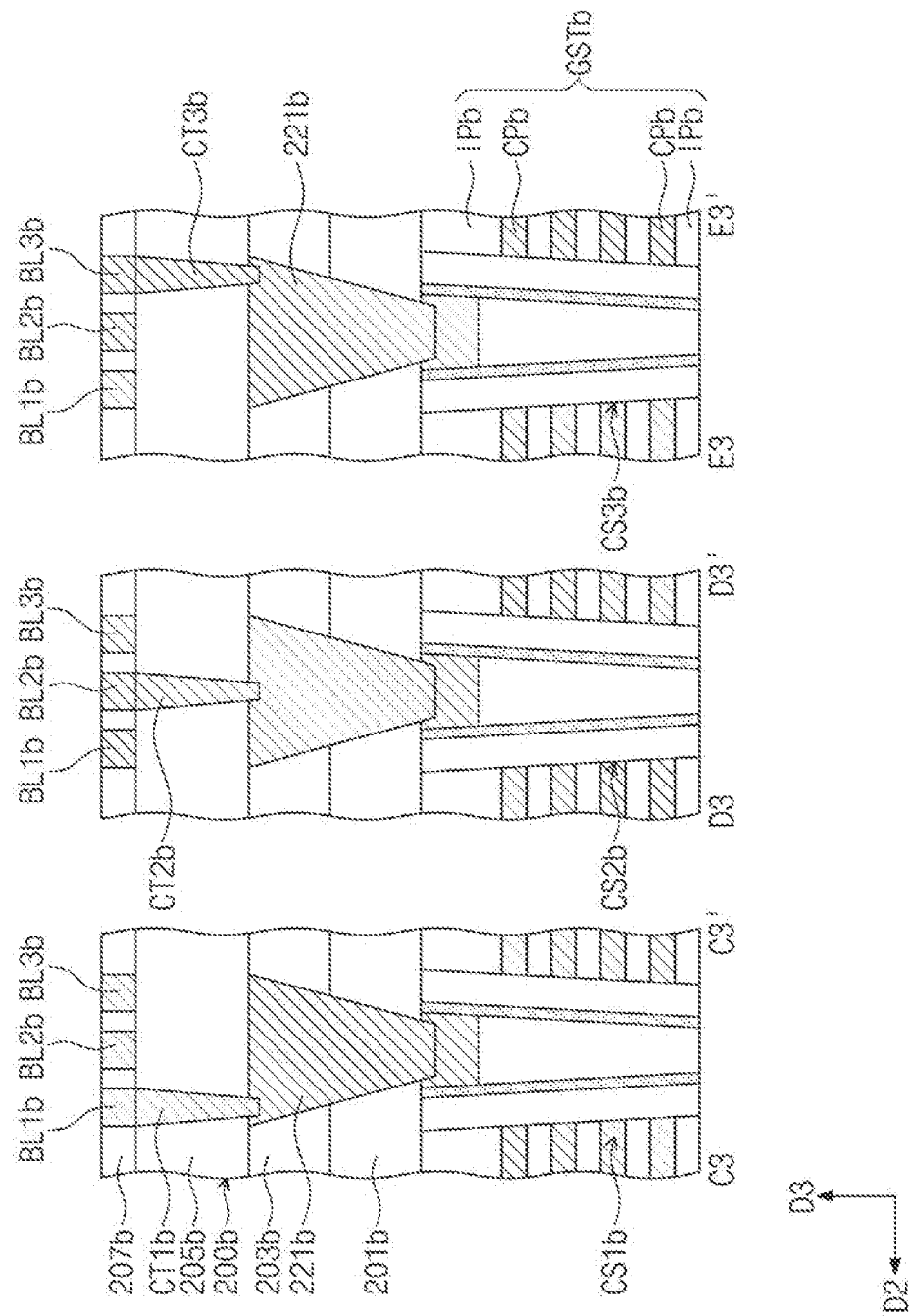
FIG. 4B is a cross-sectional view taken along lines C3-C3', D3-D3' and E3-E3' of FIG. 4A.

FIG. 4A is a plan view illustrating a semiconductor device according to some embodiments. FIG. 4B is a cross-sectional view taken along lines C3-C3', D3-D3' and E3-E3' of FIG. 4A.

Referring to FIGS. 4A and 4B, a semiconductor device may include a gate stack structure GSTb, first memory channel structures CS1b, second memory channel structures CS2b, third memory channel structures CS3b, dummy channel structures DCSb, a connection structure 200b, a first separation structure 151b, and a second separation structure 152b.

The gate stack structure GSTb may include insulating patterns IPb and conductive patterns CPb. The first and second separation structures 151b and 152b may extend in the third direction D3 to penetrate the gate stack structure GSTb. The first and second separation structures 151b and 152b may be separation structures adjacent to each other.

The first memory channel structures CS1b, the second memory channel structures CS2b, the third memory channel structures CS3b and the dummy channel structures DCSb may be disposed between the first separation structure 151b and the second separation structure 152b.

The connection structure 200b may include a first insulating layer 201b, a second insulating layer 203b on the first insulating layer 201b, a third insulating layer 205b on the second insulating layer 203b, a fourth insulating layer 207b on the third insulating layer 205b, stud contacts 221b penetrating the first and second insulating layers 201b and 203b, first, second and third contacts CT1b, CT2b and CT3b penetrating the third insulating layer 205b, and first, second and third bit lines BL1b, BL2b and BL3b in the fourth insulating layer 207b. The first to third bit lines BL1b, BL2b and BL3b may overlap with each of the memory channel structure CS1b, CS2b and CS3b in the third direction D3. Each of the first bit line BL1b, the second bit line BL2b and the third bit line BL3b may overlap with the first to third memory channel structures CS1b, CS2b and CS3b, arranged in the first direction D1, in the third direction D3.

The stud contacts 221b may be connected to the first to third memory channel structures CS1b, CS2b and CS3b, respectively.

The first bit line BL1b may be electrically connected to the first memory channel structure CS1b through the first contact CT1b and a corresponding one of the stud contacts 221b. The second bit line BL2b may be electrically connected to the second memory channel structure CS2b through the second contact CT2b and a corresponding one of the stud contacts 221b. The third bit line BL3b may be electrically connected to the third memory channel structure CS3b through the third contact CT3b and a corresponding one of the stud contacts 221b.

The first to third bit lines BL1b, BL2b and BL3b may be formed using an extreme ultraviolet (EUV) exposure process, and thus distances between the first to third bit lines BL1b, BL2b and BL3b may be relatively small.

Figure 5B:
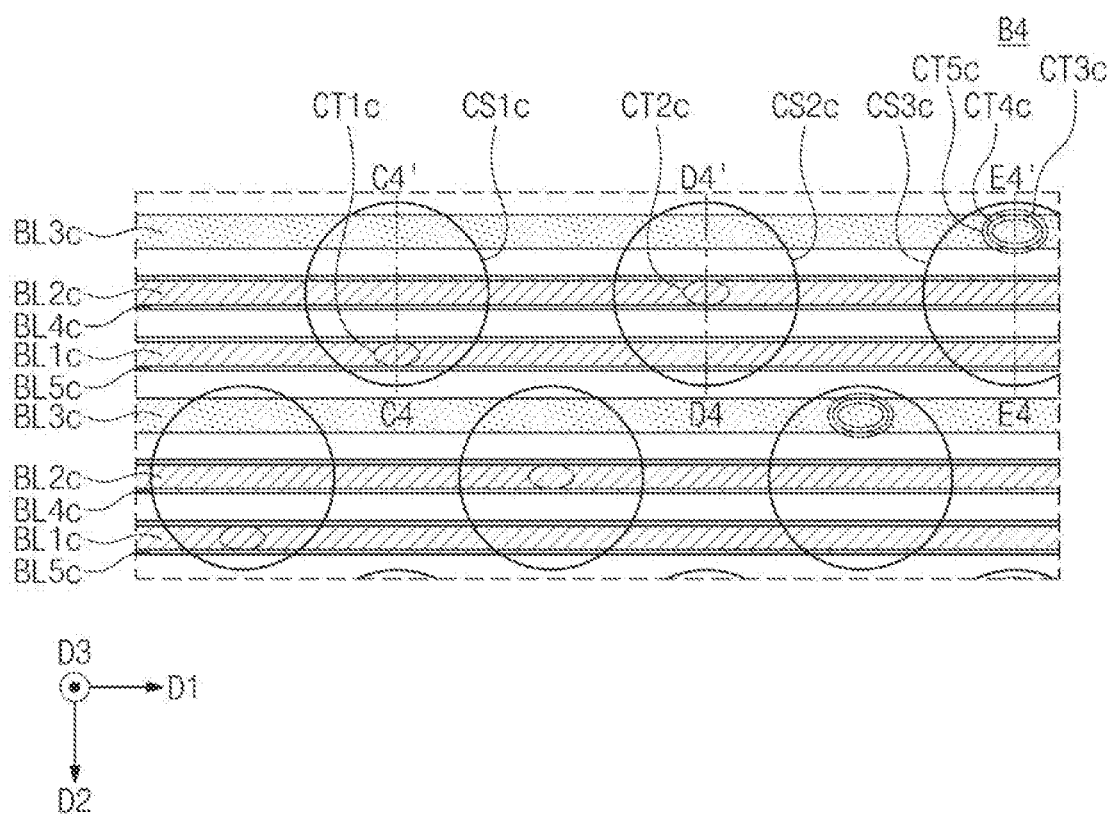
FIG. 5B is an enlarged view of a region 'B4' of FIG. 5A.
Figure 5C:
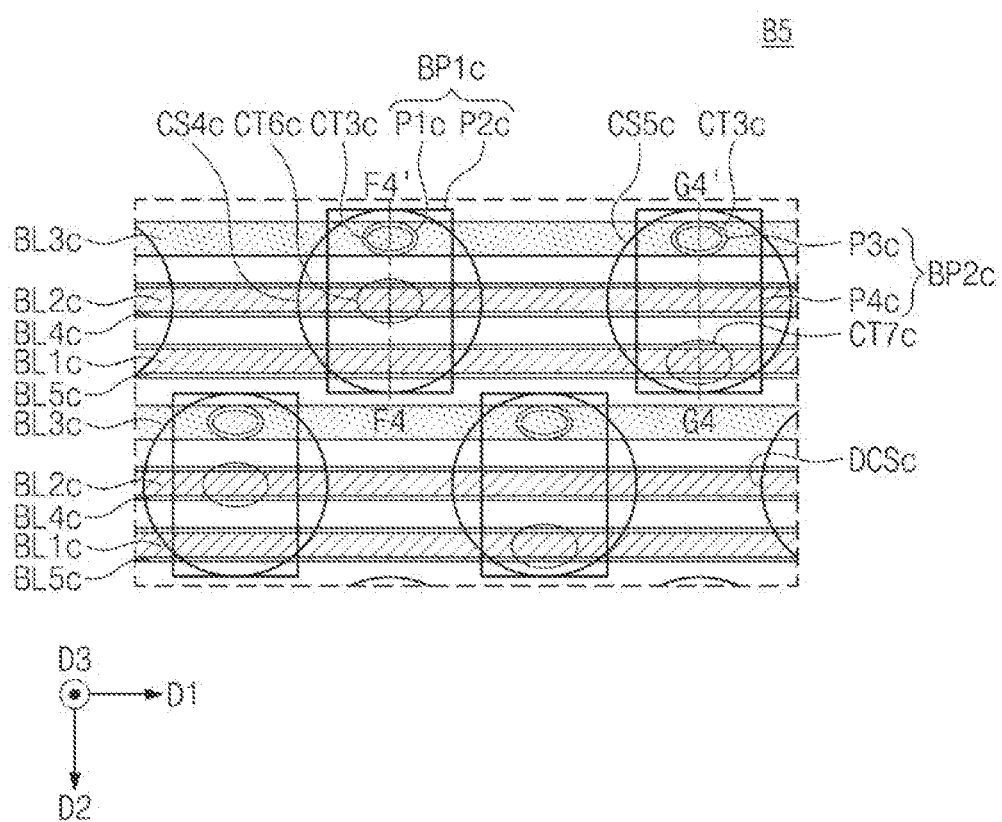
FIG. 5C is an enlarged view of a region 'B5' of FIG. 5A.
Figure 5D:
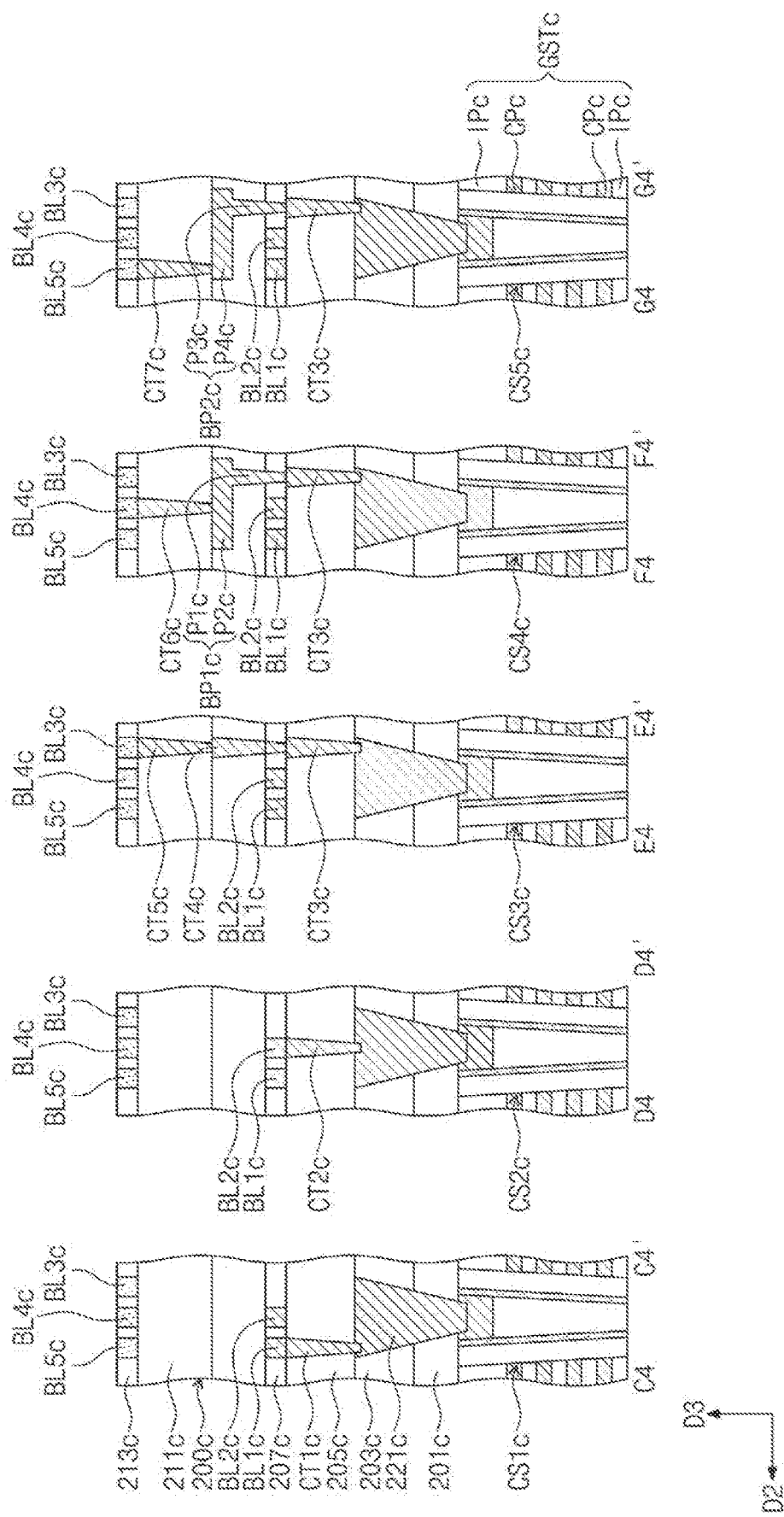
FIG. 5D is a cross-sectional view taken along lines C4-C4', D4-D4', E4-E4', F4-F4' and G4-G4' of FIGS. 5B and 5C.

FIG. 5A is a plan view illustrating a semiconductor device according to some embodiments. FIG. 5B is an enlarged view of a region 'B4' of FIG. 5A. FIG. 5C is an enlarged view of a region 'B5' of FIG. 5A. FIG. 5D is a cross-sectional view taken along lines C4-C4', D4-D4', E4-E4', F4-F4' and G4-G4' of FIGS. 5B and 5C.

Referring to FIGS. 5A, 5B, 5C and 5D, a semiconductor device may include a gate stack structure GSTc, first memory channel structures CS1c, second memory channel structures CS2c, third memory channel structures CS3c, fourth memory channel structures CS4c, fifth memory channel structures CS5c, dummy channel structures DCSc, a connection structure 200c, a first separation structure 151c, and a second separation structure 152c.

The gate stack structure GSTc may include insulating patterns IPc and conductive patterns CPc. The first and second separation structures 151c and 152c may extend in the third direction D3 to penetrate the gate stack structure GSTc. The first and second separation structures 151c and 152c may be separation structures adjacent to each other.

The first memory channel structures CS1c, the second memory channel structures CS2c, the third memory channel structures CS3c, the fourth memory channel structures CS4c, the fifth memory channel structures CS5c and the dummy channel structures DCSc may be disposed between the first separation structure 151c and the second separation structure 152c.

The connection structure 200c may include a first insulating layer 201c, a second insulating layer 203c on the first insulating layer 201c, a third insulating layer 205c on the second insulating layer 203c, a fourth insulating layer 207c on the third insulating layer 205c, a fifth insulating layer 209c on the fourth insulating layer 207c, a sixth insulating layer 211c on the fifth insulating layer 209c, a seventh insulating layer 213c on the sixth insulating layer 211c, stud contacts 221c penetrating the first and second insulating layers 201c and 203c, first, second and third contacts CT1c, CT2c and CT3c penetrating the third insulating layer 205c, first and second bit lines BL1c and BL2c in the fourth insulating layer 207c, fourth contacts CT4c, first bypass structures BP1c and second bypass structures BP2c which penetrate the fourth and fifth insulating layers 207c and 209c, fifth, sixth and seventh contacts CT5a, CT6c and CT7c penetrating the sixth insulating layer 211a, and third, fourth and fifth bit lines BL3c, BL4c and BL5c in the seventh insulating layer 213a. The first to fifth bit lines BL1c, BL2c, BL3c, BL4c and BL5c may overlap with each of the memory channel structures CS1c, CS2c, CS3c, CS4c and CS5c in the third direction D3. Each of the first bit line BL1c, the second bit line BL2c, the third bit line BL3c, the fourth bit line BL4c and the fifth bit line BL5c may overlap with the first to fifth memory channel structures CS1c, CS2c, CS3c, CS4c and CS5c, arranged in the first direction D1, in the third direction D3.

The stud contacts 221c may be connected to the first to fifth memory channel structures CS1c, CS2c, CS3c, CS4c and CS5c, respectively.

The first bit line BL1c may be electrically connected to the first memory channel structure CS1c through the first contact CT1c and a corresponding one of the stud contacts 221c. The second bit line BL2c may be electrically connected to the second memory channel structure CS2c through the second contact CT2c and a corresponding one of the stud contacts 221c. The third bit line BL3c may be electrically connected to the third memory channel structure CS3c through the fifth contact CT5c, the fourth contact CT4c, a corresponding one of the third contacts CT3c and a corresponding one of the stud contacts 221c. The fourth bit line BL4c may be electrically connected to the fourth memory channel structure CS4c through the sixth contact CT6c, the first bypass structure BP1c, a corresponding one of the third contacts CT3c and a corresponding one of the stud contacts 221c. The fifth bit line BL5c may be electrically connected to the fifth memory channel structure CS5c through the seventh contact CT7c, the second bypass structure BP2c, a corresponding one of the third contacts CT3c and a corresponding one of the stud contacts 221c.

The first bypass structure BP1c may include a first portion P1c and a second portion P2c having a width greater than that of the first portion P1c. The second bypass structure BP2c may include a first portion P3c and a second portion P4c having a width greater than that of the first portion P3c. The first bypass structure BP1c and the second bypass structure BP2c may be located at the same level.

The first and second bit lines BL1c and BL2c may be located at the same level. The third to fifth bit lines BL3c, BL4c and BL5c may be located at the same level. The third to fifth bit lines BL3c, BL4c and BL5c may be located at a higher level than the first and second bit lines BL1c and BL2c.

The first to fifth bit lines BL1c, BL2c, BL3c, BL4c and BL5c may be formed using an extreme ultraviolet (EUV) exposure process, and a distance between the first and second bit lines BL1c and BL2c and distances between the third to fifth bit lines BL3c, BL4c and BL5c may be relatively small.

The first and fifth bit lines BL1c and BL5c may overlap with each other in the third direction D3. The second and fourth bit lines BL2c and BL4c may overlap with each other in the third direction D3. The second portion P2c of the first bypass structure BP1c may overlap with the first to fifth bit lines BL1c, BL2c, BL3c, BL4c and BL5c in the third direction D3. The second portion P4c of the second bypass structure BP2c may overlap with the first to fifth bit lines BL1c, BL2c, BL3c, BL4c and BL5c in the third direction D3. The first portion P1c of the first bypass structure BP1c may overlap with the third bit line BL3c. The first portion P3c of the second bypass structure BP2c may overlap with the third bit line BL3c.

However, embodiments are not limited to the illustrated arrangement of a first channel connection structure including the first memory channel structure CS1c, the stud contact 221c and the first contact CT1c which are connected to each other, a second channel connection structure including the second memory channel structure CS2c, the stud contact 221c and the second contact CT2c which are connected to each other, a third channel connection structure including the third memory channel structure CS3c, the stud contact 221c, the third contact CT3c, the fourth contact CT4c and the fifth contact CT5c which are connected to each other, a fourth channel connection structure including the fourth memory channel structure CS4c, the stud contact 221c, the third contact CT3c, the first bypass structure BP1c and the sixth contact CT6c which are connected to each other, and a fifth channel connection structure including the fifth memory channel structure CS5c, the stud contact 221c, the third contact CT3c, the second bypass structure BP2c and the seventh contact CT7c which are connected to each other. In some embodiments, the first channel connection structure may be closest to the dummy channel structure DCSc, and the fifth channel connection structure may be farthest from the dummy channel structure DCSc.

The semiconductor device and the electronic system including the same according to the embodiments may include the bit lines overlapping with each other, and thus the density of the memory channel structures between the separation structures adjacent to each other may be increased and the integration densities of the semiconductor device and the electronic system including the same may be improved.

While some embodiments have been particularly shown and described, it will be understood by one of ordinary skill in the art that variations in form and detail may be made therein without departing from the spirit and scope of the attached claims.

What is claimed is:

1. A semiconductor device comprising,
a gate stack structure comprising insulating patterns and conductive patterns which are alternately stacked;
a first separation structure penetrating the gate stack structure;
a second separation structure penetrating the gate stack structure and being adjacent to the first separation structure;
a first memory channel structure and a second memory channel structure which penetrate the gate stack structure and are disposed between the first separation structure and the second separation structure;
a first bit line overlapping with the first memory channel structure and the second memory channel structure in a vertical direction and electrically connected to the first memory channel structure; and
a second bit line overlapping with the first memory channel structure, the second memory channel structure and the first bit line in the vertical direction and electrically connected to the second memory channel structure.

2. The semiconductor device of claim 1, further comprising:
a dummy channel structure penetrating the gate stack structure,
wherein a distance between the first memory channel structure and the dummy channel structure is greater than a distance between the second memory channel structure and the dummy channel structure.

3. The semiconductor device of claim 1, wherein a level of the first bit line is lower than a level of the second bit line.

4. The semiconductor device of claim 1, further comprising:
a bypass structure electrically connecting the second bit line to the second memory channel structure,
wherein the bypass structure includes a first portion having a first width and a second portion having a second width greater than the first width.

5. The semiconductor device of claim 4, wherein the second portion of the bypass structure overlaps with the first bit line in the vertical direction.

6. The semiconductor device of claim 4, wherein a level of at least a portion of the first portion of the bypass structure is located at a same level as a level of the first bit line.

7. The semiconductor device of claim 4, wherein a level of the second portion of the bypass structure is higher than a level of the first bit line.

8. The semiconductor device of claim 1, further comprising:
a third memory channel structure penetrating the gate stack structure and disposed between the first separation structure and the second separation structure; and
a third bit line electrically connected to the third memory channel structure.

9. The semiconductor device of claim 8, wherein a level of the third bit line is located at a same level as a level of the second bit line.

10. A semiconductor device comprising:
a gate stack structure comprising insulating patterns and conductive patterns which are alternately stacked;
a first memory channel structure and a second memory channel structure which penetrate the gate stack structure;
a first bit line overlapping with the first memory channel structure and the second memory channel structure in a vertical direction and electrically connected to the first memory channel structure;
a second bit line overlapping with the first memory channel structure and the second memory channel structure in the vertical direction and electrically connected to the second memory channel structure; and
a first bypass structure electrically connecting the second bit line to the second memory channel structure,
wherein the first bypass structure includes a first portion having a first width and a second portion having a second width greater than the first width, and
wherein the second portion of the first bypass structure overlaps with the first bit line in the vertical direction.

11. The semiconductor device of claim 10, wherein a bottom surface of the second portion of the first bypass structure faces a top surface of the first bit line.

12. The semiconductor device of claim 10, wherein the first bit line overlaps with the second bit line in the vertical direction.

13. The semiconductor device of claim 10, further comprising:
- a third memory channel structure penetrating the gate stack structure and overlapping with the first bit line and the second bit line in the vertical direction; and
- a third bit line electrically connected to the third memory channel structure.

14. The semiconductor device of claim 13, further comprising:
- a second bypass structure electrically connecting the third bit line to the third memory channel structure,
- wherein the second bypass structure includes a first portion having a third width and a second portion having a fourth width greater than the third width.

15. The semiconductor device of claim 14, wherein the second portion of the second bypass structure overlaps with the first bit line and the second bit line in the vertical direction.

16. The semiconductor device of claim 13, further comprising:
- a fourth memory channel structure penetrating the gate stack structure and overlapping with the first bit line, the second bit line and the third bit line in the vertical direction; and
- a fourth bit line electrically connected to the fourth memory channel structure.

17. The semiconductor device of claim 16, wherein a level of the fourth bit line is located at a same level as a level of the third bit line.

18. The semiconductor device of claim 10, further comprising:
- a third memory channel structure penetrating the gate stack structure; and
- a third bit line electrically connected to the third memory channel structure and located at a same level as a level of the first bit line.

19. An electronic system comprising:
- a main board;
- a semiconductor device on the main board; and
- a controller electrically connected to the semiconductor device on the main board, wherein the semiconductor device comprises:
- a gate stack structure comprising insulating patterns and conductive patterns which are alternately stacked;
- a first separation structure penetrating the gate stack structure
- a second separation structure penetrating the gate stack structure and being adjacent to the first separation structure;
- a first memory channel structure, a second memory channel structure and a third memory channel structure which penetrate the gate stack structure and are disposed between the first separation structure and the second separation structure;
- a first bit line overlapping with each of the first memory channel structure, the second memory channel structure, the third memory channel structure in a vertical direction, and electrically connected to the first memory channel structure;
- a second bit line overlapping with each of the first memory channel structure, the second memory channel structure, the third memory channel structure, and the first bit line in a vertical direction, and electrically connected to the second memory channel structure;
- a third bit line overlapping with each of the first memory channel structure, the second memory channel structure, and the third memory channel structure in the vertical direction, and electrically connected to the third memory channel structure; and
- a bypass structure electrically connecting the second bit line to the second memory channel structure,
- wherein the third bit line is located at a same level as a level of the second bit line.

20. The electronic system of claim 19, wherein the bypass structure includes a first portion and a second portion on the first portion, and
- wherein the second portion of the bypass structure overlaps with the first bit line and the second bit line in the vertical direction.

* * * * *